(12) United States Patent
Yoshida

(10) Patent No.: US 8,007,234 B2
(45) Date of Patent: Aug. 30, 2011

(54) AXIAL FAN UNIT HAVING COAXIALLY ARRANGED AXIAL FANS

(75) Inventor: Yusuke Yoshida, Kyoto (JP)

(73) Assignee: Nidec Corporation, Kyoto (JP)

( * ) Notice: Subject to any disclaimer, the term of this patent is extended or adjusted under 35 U.S.C. 154(b) by 1132 days.

(21) Appl. No.: 11/752,951

(22) Filed: May 24, 2007

(65) Prior Publication Data

US 2007/0274821 A1  Nov. 29, 2007

(30) Foreign Application Priority Data

May 29, 2006 (JP) ................................. 2006-148149

(51) Int. Cl.
*F04D 29/52* (2006.01)
(52) U.S. Cl. .... 415/222; 415/223; 415/220; 417/423.14
(58) Field of Classification Search .................... 415/60, 415/66, 68, 213.1, 220, 222, 223, 232; 416/120, 416/124, 128, 198 R; 417/423.14
See application file for complete search history.

(56) References Cited

U.S. PATENT DOCUMENTS

| | | | |
|---|---|---|---|
| 6,174,145 B1 * | 1/2001 | Taniguchi | 417/423.14 |
| 7,140,837 B2 * | 11/2006 | Ku et al. | 415/121.2 |
| 7,156,611 B2 * | 1/2007 | Oosawa et al. | 415/68 |
| 7,445,423 B2 * | 11/2008 | Ishihara et al. | 415/61 |
| 2006/0280632 A1 * | 12/2006 | Sugiyama et al. | 417/423.5 |
| 2009/0122976 A1 * | 5/2009 | Edelmann et al. | 379/413.04 |

FOREIGN PATENT DOCUMENTS

| | | |
|---|---|---|
| JP | 61-17500 | 1/1986 |
| JP | 61-164498 | 10/1986 |
| JP | 62-135551 | 8/1987 |
| JP | 4-131162 | 12/1992 |
| JP | 2004-278370 | 10/2004 |
| JP | 2004-278371 | 10/2004 |

* cited by examiner

*Primary Examiner* — Edward Look
*Assistant Examiner* — Ryan Ellis
(74) *Attorney, Agent, or Firm* — Volentine & Whitt, PLLC

(57) ABSTRACT

First and second axial fans are coaxially connected to each other. Each axial fan includes an impeller rotatable about a center axis; a motor rotating the impeller about the center axis, a housing member surrounding the impeller and having a hollow body and approximately square flanges at axial ends of the body, and a group of wires electrically connected to the motor. The axial fans are joined together with their flanges coincident with each other as seen along the center axis. The housing member is provided with first and second receiving portions at least one flange on a center-axis side of an outer periphery of the flange. The groups of wires of the axial fans are pulled out therefrom and extend axially toward a side of the first axial fan opposite to the second axial fan, with passing through the first and second receiving portions, respectively.

39 Claims, 13 Drawing Sheets

AXIAL FAN UNIT HAVING COAXIALLY ARRANGED AXIAL FANS

BACKGROUND OF THE INVENTION

1. Field of the Invention

The present invention relates to an axial fan unit in which two or more axial fans are coaxially arranged with and connected to each other, and an axial fan for use in the axial fan unit.

2. Description of the Related Art

Axial fans have been used for cooling electronic components in electronic devices such as personal computers and servers. Each axial fan is usually connected to an external power supply via wires which are connected to a motor in a housing of the axial fan and pulled out to the outside of the housing.

Two or more axial fans coaxially arranged with and connected to each other form an axial fan unit. A wire for current from the power supply and a wire connected to the ground are connected to the motor of each axial fan. In addition, a wire for a control signal used in, for example, PWM (pulse width modulation) control and a wire for a sensor signal from a lock sensor or a rotation sensor are connected to the motor.

Those wires are axially pulled out along a side surface of the housing so as not to protrude from an outer shape of flanges provided at axial ends of the housing, and are then pulled out via a wire-outlet port formed in one of the flanges. This configuration prevents the wires from being caught by or brought into contact with something in the electronic device, and damages of the wires are therefore prevented.

In general axial fan units, many wires are pulled out from respective axial fans. Thus, the air-outlet port via which the wires are pulled out to the outside of the axial fan unit has to be sufficiently large. In order to achieve this, there are two approaches. The first approach is to increase the size of the flange and housing. The second approach is to reduce a diameter of a path for an air flow, which is formed on a center-axis side of the wire-outlet port, i.e., an inner diameter of the housing, without changing the size of the flange. The reduction in the inner diameter of the housing makes it difficult to provide both a required air flow rate and a required static pressure. Moreover, considering recent increase in power consumption of the motor of the axial fan, another approach, i.e., to reduce a diameter of each wire in order to prevent the size increase of the wire-outlet port is impractical.

Growing diversity of axial fan unit design has raised the possibility that the position at which the wires are pulled out from the axial fan unit is varied depending on a wiring technique employed in a product incorporating the axial fan unit therein. However, conventional axial fans are designed such that the wires are pulled out from the axial fan unit at an unchanged position. Thus, it is difficult to change the position at which the wires are pulled but from the axial fan unit.

SUMMARY OF THE INVENTION

According to an aspect of preferred embodiments of the present invention, an axial fan unit includes first and second axial fans coaxial with and connected to each other. The first axial fan includes: a first impeller having first blades disposed about a center axis of the first and second axial fans; a first motor operable to rotate the first impeller about the center axis to generate an axial air flow; and a first housing member including a hollow, approximately cylindrical first body surrounding the first impeller and approximately square first flanges provided at axial ends of the first body. The second axial fan includes: a second impeller having first blades disposed about a center axis of the first and second axial fans; a second motor operable to rotate the second impeller about the center axis to generate an axial air flow in the same direction as that generated by rotation of the first impeller; and a second housing member including a hollow, approximately cylindrical second body surrounding the second impeller and approximately square second flanges provided at axial ends of the second body. The first flanges of the first housing member and the second flanges of the second housing member have approximately the same outer shape as seen along the center axis. The first and second housing members are joined together such that outer peripheries of the first flanges and the second flanges are substantially coincident with one another as seen along the center axis. The first housing member includes first and second receiving portions, formed in one of the first flanges and adjacent to different sides of the outer shape of the first flanges, for receiving therein first and second groups of wires electrically connected to the first and second motors to allow the first and second groups of wires to extend approximately axially without protruding beyond outer peripheries of the first flanges, respectively.

The first housing member preferably includes first and second restriction portions provided adjacent to the first and second receiving portions, respectively. A portion of each of the first and second restriction portions is formed by a portion of an outer peripheral surface of the first flange in which the first and second restriction portions are formed to prevent an associated one of the first and second groups of wires from protruding from the outer peripheries of the first flange. It is more preferable that each restriction portion be a hook having an outer surface formed by the portion of the outer peripheral surface of the first flange.

The first housing member preferably includes at least one rib axially extending on an outer surface of the first body between the first flanges.

The first housing member may be provided with a guiding groove, axially extending on an outer surface of the first body between the first flanges and associated with the first and second receiving portions, for guiding parallel to the center axis one of the first and second groups of wires to or from one of the first and second receiving portions which is associated with the one group of wires.

According to another aspect of the preferred embodiments of the present invention, an axial fan unit includes first and second axial fans coaxial with and connected to each other. Each of the first and second axial fans includes: an impeller operable to rotate about a center axis of the first and second axial fans; an electric motor operable to rotate the impeller about the center axis; a housing member surrounding the impeller and having a hollow body and approximately square flanges at axial ends of the body, the flanges being of approximately the same outer shape as each other as seen along the center axis; and a group of wires electrically connected to the electric motor. The first and second axial fans are joined together with outer peripheries of the flanges thereof coincident with each other as seen along the center axis. The housing member includes first and second receiving portions for receiving the groups of wires of the first and second axial fans therein, respectively, on a center-axis side of an outer periphery of the flanges, and the first and second receiving portions are provided through the same one of the flanges or the respective flanges. The groups of wires of the first and second axial fans extend axially toward a side of the first axial fan opposite to the second axial fan, with passing through the first and second receiving portions, respectively.

Other features, elements, advantages and characteristics of the present invention will become more apparent from the following detailed description of preferred embodiments thereof with reference to the attached drawings.

DETAILED DESCRIPTION OF PREFERRED EMBODIMENTS

Figure 1A:
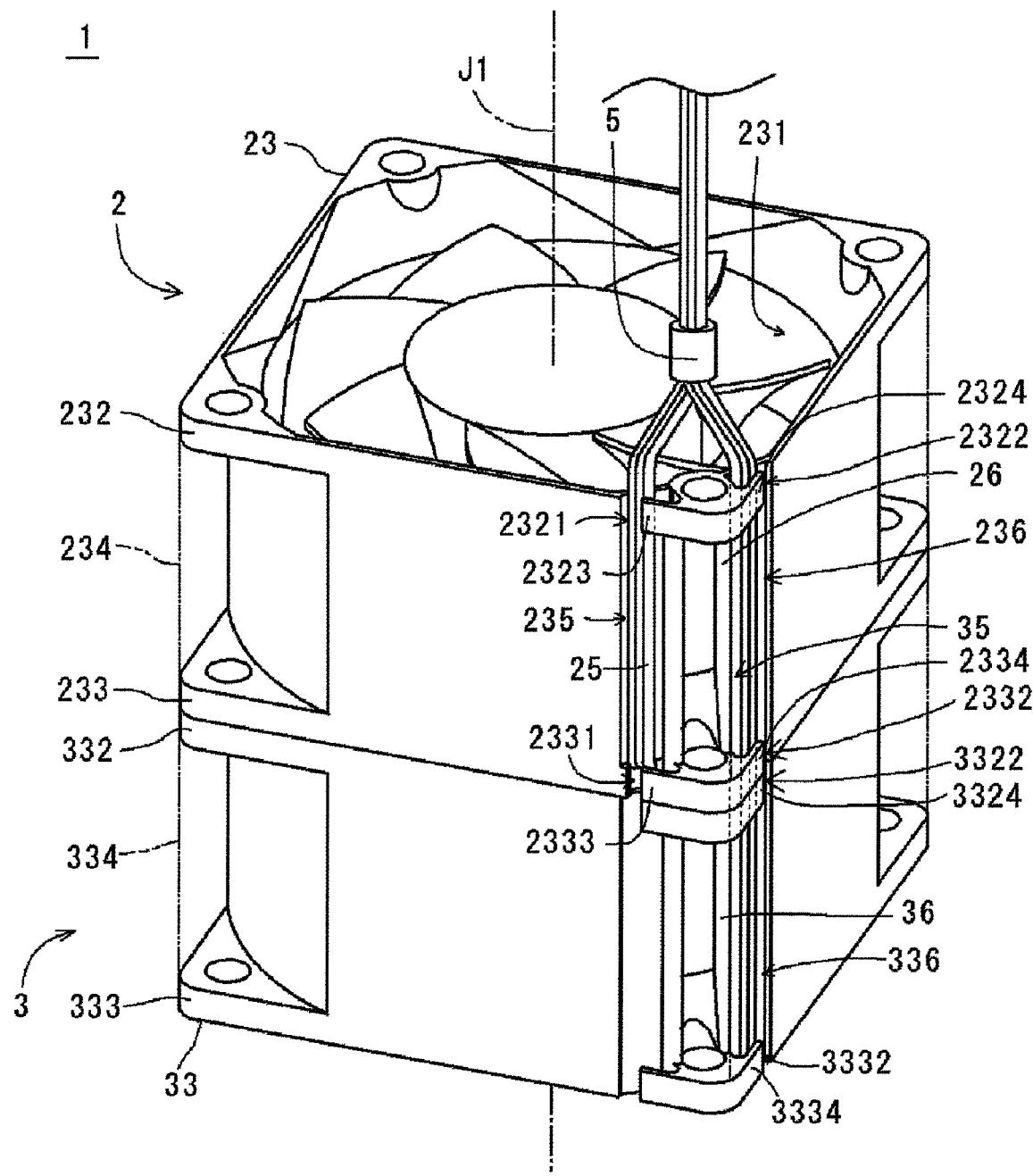
FIG. 1A is a perspective view of an axial fan unit according to a first preferred embodiment of the present invention.

Referring to FIGS. 1A through 12, preferred embodiments of the present invention will be described in detail. It should be noted that in the explanation of the present invention, when positional relationships among and orientations of the different components are described as being up/down or left/right, ultimately positional relationships and orientations that are in the drawings are indicated; positional relationships among and orientations of the components once having been assembled into an actual device are not indicated. Meanwhile, in the following description, an axial direction indicates a direction parallel to a center axis, and a radial direction indicates a direction perpendicular to the center axis.

First Preferred Embodiment

Figure 2:
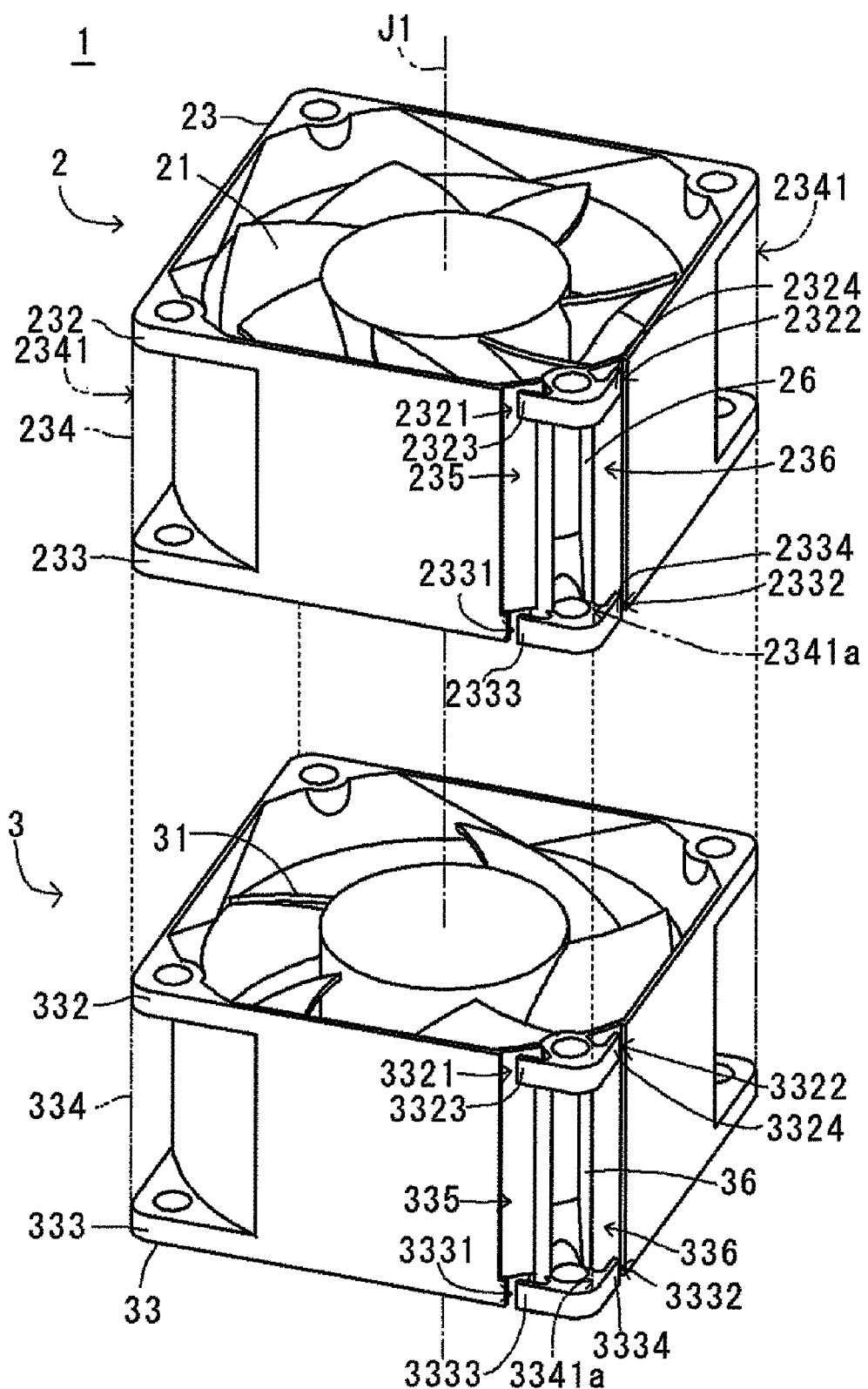
FIG. 2 is an exploded perspective view of the axial fan unit of FIG. 1A.

FIG. 1A is a perspective view of an axial fan unit 1 according to a first preferred embodiment of the present invention. FIG. 2 is an exploded perspective view of the axial fan unit 1. The axial fan unit 1 is preferably used, for example, as an electric cooling fan which cools an electronic device such as a server. As shown in FIG. 1A, the axial fan unit 1 includes a first axial fan 2 and a second axial fan 3 which are coaxially arranged with and connected to each other in series along a center axis J1 of the axial fan unit 1. In this preferred embodiment, the first fan 2 is arranged axially above the second axial fan 3, as shown in FIG. 1A. The first and second axial fans 2 and 3 are secured to each other, for example, by screwing, or another fastening means or method. In FIG. 2, wires pulled out from the first and second axial fans 1 and 2 are omitted for the sake of convenience.

The axial fan unit 1 serves as a counter-rotating fan. That is, rotating directions of the first and second axial fans 2 and 3 are opposite to each other. When a first impeller 21 of the first axial fan 2 and a second impeller 31 of the second axial fan 3 are rotated in opposite directions to each other, air is taken in from above the first axial fan 2 and is sent downward in an axial direction that is substantially parallel or parallel to the center axis J1, i.e., toward the second axial fan 3, thereby creating an axial air flow flowing downward. In the following description, the upper side in FIG. 1A from which air is taken in is referred to as an "air-inlet side" and the lower side in FIG. 1A from which air is discharged is referred to as an "air-outlet side". In general, a static pressure and an air flow rate provided by axial fan units formed by coaxially arranged axial fans can be increased by rotating the first and second impellers 21 and 31 in opposite directions to each other, as compared with a case where the first and second impellers 21 and 31 are rotated in the same direction as each other.

Figure 3:
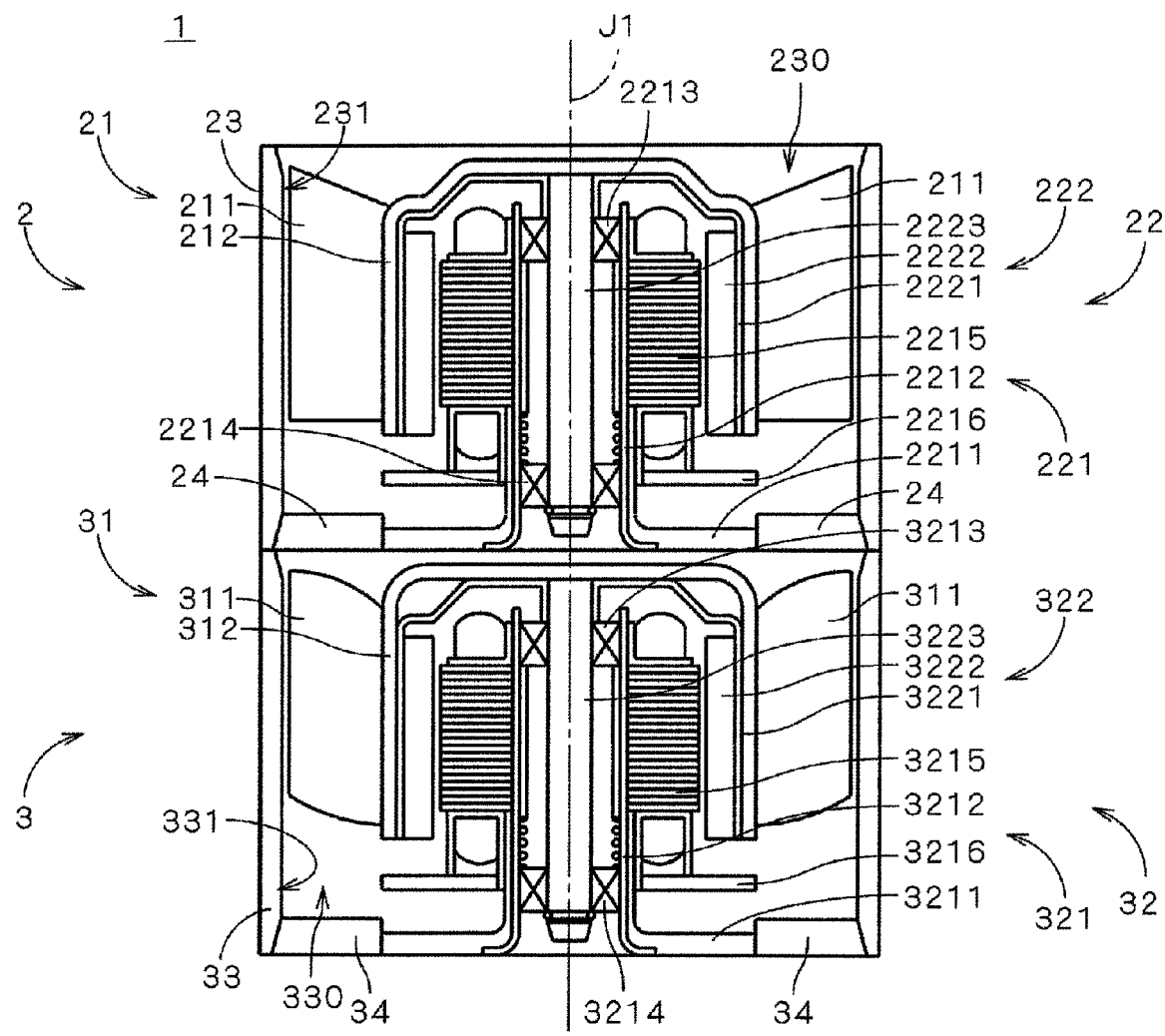
FIG. 3 is a cross-sectional view of the axial fan unit of FIG. 1A.
Figure 4:
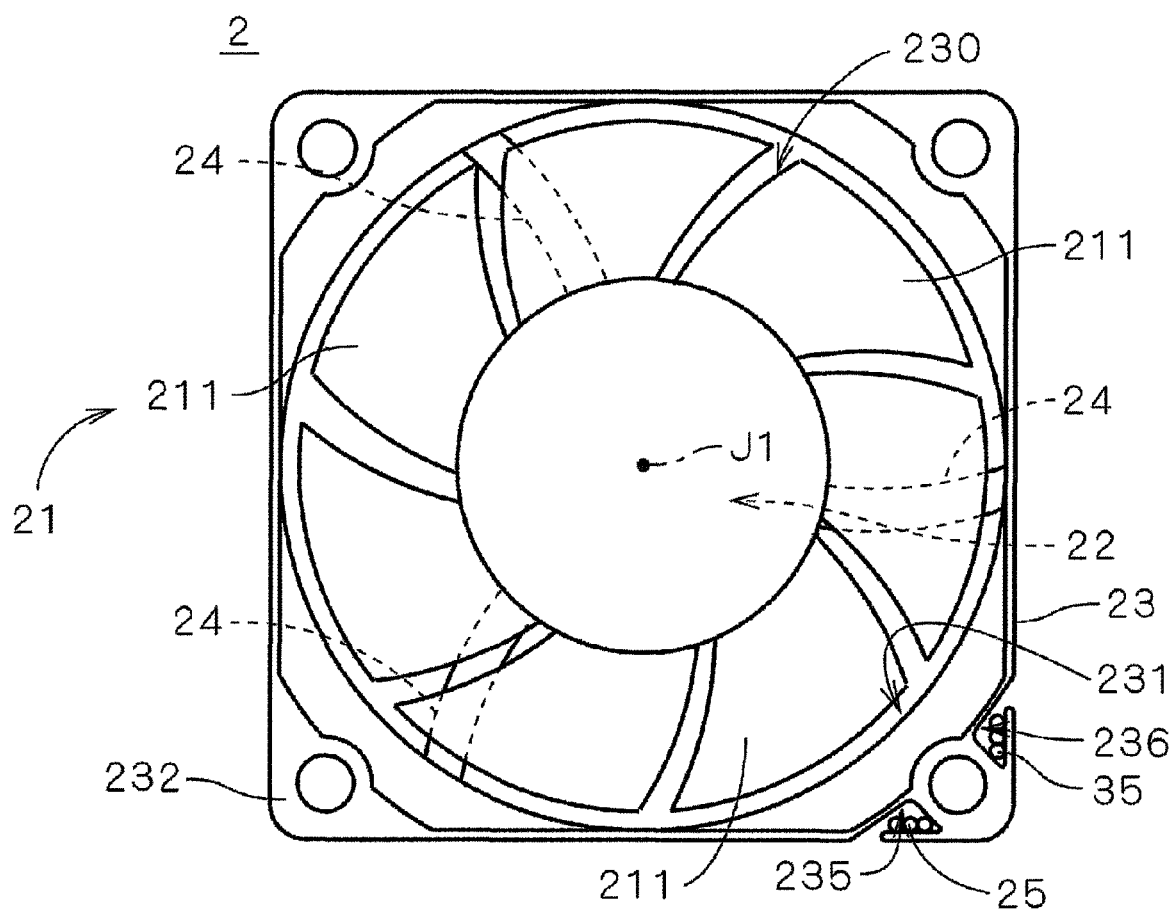
FIG. 4 is a plan view of a first axial fan in the axial fan unit of FIG. 1A.

FIG. 3 is a cross-sectional view of the axial fan unit 1, taken along a plane containing the center axis J1. FIG. 4 is a plan view of the first axial fan 2 when seen from the air-inlet side.

As shown in FIGS. 3 and 4, the first axial fan 2 includes the first impeller 21 having a plurality of first blades 211, a first motor 22, a first housing member 23, and a plurality of first supporting ribs 24. In this preferred embodiment, seven first blades 211 and three first supporting ribs 24 are preferably provided, for example. The first blades 211 are disposed about the center axis J1 at regular intervals. The first motor 22 rotates the first impeller 21 about the center axis J1 in a first rotating direction so as to generate an axial air flow. In the shown example, the first rotating direction is a clockwise direction in FIGS. 2 and 4. The air flow generated by rotation of the first impeller 21 flows downward in the axial direction in FIG. 3. The first housing member 23 includes a hollow, approximately cylindrical body which accommodates the first impeller 21 and the first motor 22 therein. The first housing member 23 is disposed outside the first impeller 21 in a radial direction that is substantially perpendicular or perpendicular to the axial direction, thereby surrounding the first impeller 21. The first supporting ribs 24 are radially disposed about the center axis J1 to connect the first motor 22 to the first housing member 23. In this manner, the first supporting ribs 24 support the first motor 22. In the first axial fan 2, the first impeller 21, the first motor 22, and the first supporting ribs 24 are disposed in a path 230 inside the first housing member 23.

Referring to FIG. 3, the first motor 22 includes a stator 221 as a stationary assembly and a rotor 222 as a rotating assembly. The rotor 222 is supported by a bearing assembly described later, in a rotatable manner about the center axis J1 relative to the stator 221. In the following description, the rotor side and the stator side in the axial direction are referred to as upper and lower sides in the axial direction for the sake of convenience, respectively. However, it is unnecessary that the axial direction is coincident with a direction of gravity.

The stator 221 includes a base portion 2211. The base portion 2211 has an approximately annular shape centered on the center axis J1 when seen in the axial direction. The base portion 2211 is secured to an inner side surface 231 of the first housing member 23 with the first supporting ribs 24, as shown in FIGS. 3 and 4, and supports other components of the stator 221. The base portion 2211 is preferably made of resin and is preferably formed by injection molding together with the first supporting ribs 24 and the first housing member 23 both of which are also preferably made of resin. Thus, the base portion 2211, the first supporting ribs 24, and the first housing member 23 form a continuous component.

The base portion 2211 has an opening at its center. Referring to FIG. 3, a hollow, approximately cylindrical bearing holder 2212 is secured to a portion of the base portion 2211 defining the opening. The bearing holder 2212 extends upward (i.e., toward the rotor 222) from the base portion 2211. Inside the bearing holder 2212, ball bearings 2213 and 2214 are disposed in an upper portion and a lower portion in the axial direction, respectively. The ball bearings 2213 and 2214 define a portion of the bearing assembly.

The stator 221 also includes an armature 2215 disposed radially outside the bearing holder 2212. In this preferred embodiment, the armature 2215 is attached to the base portion 2211 near the baring holder 2212. In the stator 221, a circuit board 2216 preferably in the form of an approximately annular plate is attached axially below the armature 2215 and is electrically connected to the armature 2215. A circuit (not shown) on the circuit board 2216 controls the armature 2215.

A first group of wires 25 which are pulled out from the first motor 22 are connected to the circuit board 2216 shown in FIG. 3. In the example shown in FIGS. 1A and 4, three wires form the first group of wires 25. The first group of wires 25 are pulled out through the path 230 defined in the first housing member 23 to the outside and are connected to an external power supply.

The rotor 222 includes a yoke 2221 made of magnetic metal. The yoke 2211 is hollow and approximately cylindrical, is centered on the center axis J1, and is provided with a lid for closing an axially upper end of the yoke 2211. In the rotor 222, a hollow, approximately cylindrical magnet 2222 for generating a magnetic field is secured to an inner surface of a sidewall of the yoke 2221, i.e., an inner side surface of the yoke 2221. The magnet 2222 is arranged to face the armature 2214.

The rotor 222 further includes a shaft 2223 extending from the lid of the yoke 2221 downward in the axial direction. The shaft 2223 is inserted into the bearing holder 2212 and is supported by ball bearings 2213 and 2214 in a rotatable manner. In the first axial fan 2, the shaft 2223 and the ball bearings 2213 and 2214 form the bearing assembly which supports the yoke 2221 in a rotatable manner about the center axis J1 relative to the base portion 2211.

The first impeller 21 includes a hollow, approximately cylindrical hub 212 which has a lid closing an axially upper end thereof. The hub 212 covers the outside of the yoke 2221 of the first motor 22. The first impeller 21 also includes a plurality of first blades 211 radially extending from the outside of a sidewall of the hub 212, i.e., an outer side surface of the hub 212. The first blades 211 are disposed about the center axis J1. The hub 212 and the first blades 211 are preferably made of resin and are preferably formed integrally with each other by injection molding together.

In the first axial fan 2, driving current is supplied to the armature 2215 via the first group of wires 25 (see FIG. 1) connected to the circuit board 2216 of the first motor 22. The driving current is controlled, thereby generating a torque centered on the center axis J1 by interaction between the armature 2215 and the magnet 2222. The torque rotates the rotor 222 about the center axis J1 so as to turn the first blades 211 of the impeller 21 attached to the rotor 222 around the center axis J1 in a counterclockwise direction in FIG. 4. Thus, air is taken in from the upper side (from the second axial fan side) in FIG. 3, and is sent to the lower side in FIG. 3, i.e., toward the first supporting ribs 24.

Figure 5:
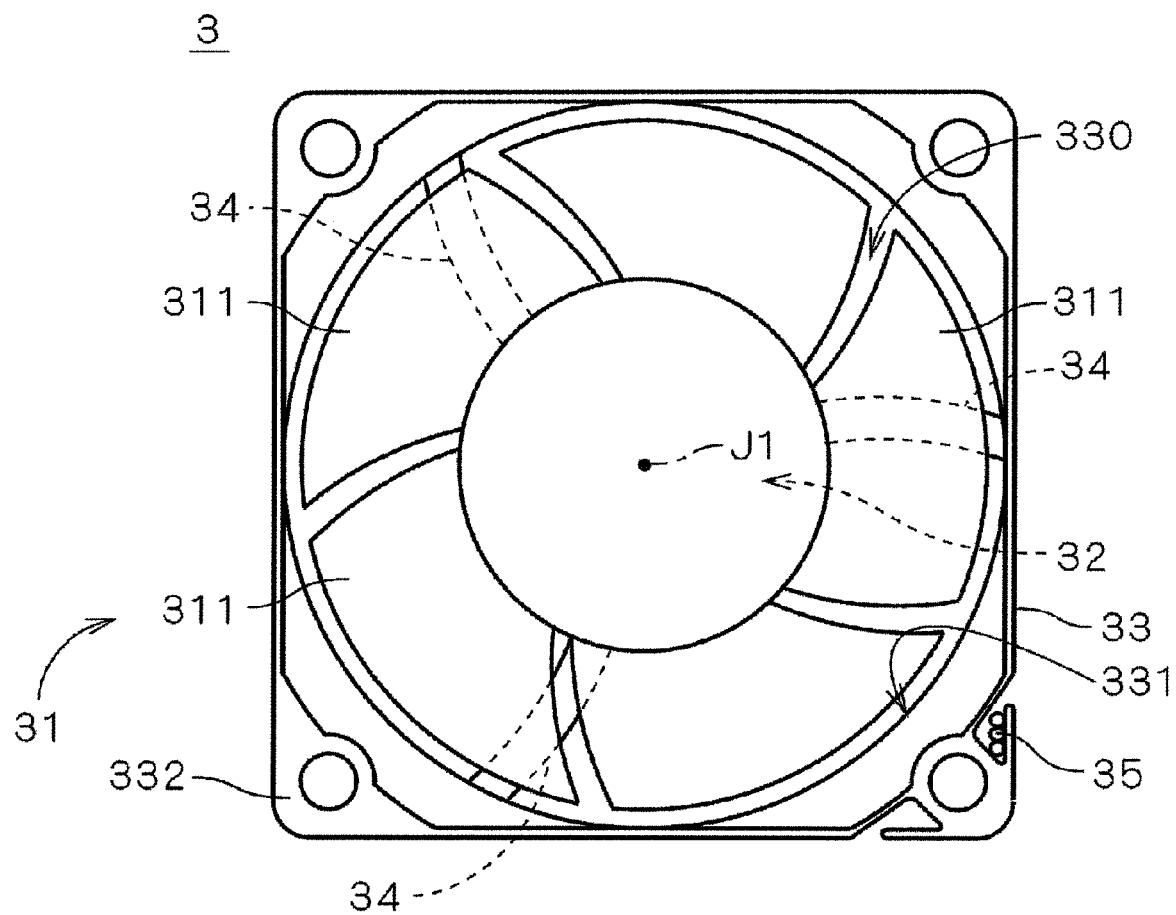
FIG. 5 is a plan view of a second axial fan in the axial fan unit of FIG. 1A.

FIG. 5 is a plan view of the second axial fan 3 when axially seen from the air-inlet side (i.e., from the second fan side). Referring to FIGS. 3 and 5, the second axial fan 3 includes a second impeller 31 disposed adjacent to the first impeller 21 in the axial direction. The second impeller 31 has a plurality of second blades 311 radially arranged about the center axis J1 at regular intervals. In this preferred embodiment, five second blades 311 are preferably provided, for example.

The second axial fan 3 also includes a second motor 32, a second housing member 33, and a plurality of second supporting ribs 34. In this preferred embodiment, three second supporting ribs 34 are preferably provided, for example. The second motor 32 rotates the second impeller 31 about the center axis J1 in a second rotating direction opposite to the first rotating direction of the first impeller 21 so as to generate an air flow flowing in the same direction as that generated by the first impeller 21. In the shown example, the second rotating direction is a clockwise direction in FIGS. 2 and 5. The air flow generated by the second impeller 31 flows downward in the axial direction in FIG. 3. The second housing member 33 is disposed outside the second impeller 31 in the radial direction to surround the second impeller 31. The second housing member 33 has an inner side surface 331 defining a hollow cylinder in which the second impeller 31 and the second motor 32 are accommodated. The second supporting ribs 34 are disposed between the first and second impellers 21 and 31, and radially extend from the second motor 32 to the second housing member 33. That is, the second supporting ribs 34 connect the second motor 33 to the second housing member 33.

In the second axial fan 3, the second impeller 31, the second motor 32, and the second supporting ribs 34 are disposed in a path 330 inside the second housing member 33 in a similar manner to that in the first axial fan 2. In this preferred embodiment, the number of the second supporting ribs 34 is equal to the number of the first supporting ribs 24 (see FIG. 4), and the first and second housing members 23 and 33 have substantially the same shape as each other.

The second motor 32 preferably has substantially the same structure as the first motor 22. Referring to FIG. 3, the second motor 32 includes a stator 321 and a rotor 322 disposed axially above the stator 321 (i.e., on the air-intake side of the stator 321). The second motor 32 is supported in a rotatable manner relative to the stator 321.

The stator 321 includes a base portion 3211 secured to the inner side surface 331 of the second housing member 33 with the second supporting ribs 34. The base portion 3211 supports other components of the stator 321. The stator 321 also includes a hollow, approximately cylindrical bearing holder 3212 with ball bearings 3213 and 3214 disposed therein, an armature 3215 disposed outside the bearing holder 3212, and a circuit board 3216 preferably in the form of an approximately annular plate which is attached axially below the armature 3215. The circuit board 3216 is electrically connected to the armature 3215. A circuit (not shown) on the circuit board 3216 controls the armature 3215.

The base portion 3211 is preferably made of resin and is preferably formed by injection molding together with the second supporting ribs 34 and the second housing member 33 both of which are made of resin. Thus, the base portion 3211, the second supporting ribs 34, and the second housing member 33 form a continuous component.

A second group of wires 35 which are pulled out from the second motor 32 are connected to the circuit board 3216 shown in FIG. 3. In this preferred embodiment, three wires form the second group of wires 35, as shown in FIGS. 1A and 5. The second group of wires 35 are pulled out through the path 330 defined in the second housing 33 to the outside and are connected to an external power supply.

The rotor 322 includes a metal yoke 3221, a magnet 3222 for generating a magnetic field, secured to an inner side surface of the yoke 3221, and a shaft 3223 extending downward from the yoke 3221. The shaft 3223 is supported by the ball bearings 3213 and 3214 in the bearing holder 3212 in a rotatable manner. In the second axial fan 3, the shaft 3223 and the ball bearings 3213 and 3214 define together a bearing assembly for supporting the yoke 3221 in a rotatable manner about the center axis J1 relative to the base portion 3211.

The second impeller 31 includes a hollow, approximately cylindrical hub 312 with a lid, and a plurality of second blades 311 radially extending from an outer side surface of the hub 312. The second blades 311 are disposed about the center axis J1. The hub 312 covers the outside of the yoke 3221 of the second motor 32. The hub 312 and the second blades 312 are preferably made of resin and are preferably formed by injection molding together.

When a driving current is supplied to the second motor 32 via the second group of wires 35 (see FIG. 1A) connected to the circuit board 3216 of the second motor 32 in the second housing member 33, the second blades 311 of the second impeller 31 are turned about the center axis J1 in a counterclockwise direction in FIG. 5. Thus, air is taken into the second axial fan 3 from the upper side in FIG. 3 (from the first axial fan side) and is discharged downward in the axial direction, i.e., toward the second supporting ribs 34.

In the axial fan unit 1, the first housing member 23 includes a hollow, approximately cylindrical body and flanges provided at axial ends of the body. Referring to FIG. 4, an inner surface 231 of the body is disposed radially outside the first impeller 21 to surround it. At the axial ends of the body are provided an air-inlet side flange 232 and an air-outlet side flange 233 which are approximately square when seen in the axial direction and each has four corners, as shown in FIGS. 2 and 4. In the following description, the air-inlet side flange 232 and the air-outlet side flange 233 of the first housing member 23 are referred to as the first air-inlet side flange 232 and the first air-outlet side flange 233, respectively. Those flanges 232 and 233 have approximately the same outer shape are arranged with their outer peripheries coincident with each other, when seen in the axial direction.

In this preferred embodiment, when the first air-inlet side flange 232 and the first air-outlet side flange 233 are connected to each other along the center axis J1, an imaginary quadrangular prism 234 is formed which has approximately square axial ends and side surfaces parallel to the center axis J1, as shown in FIGS. 1A and 2. The side surfaces are shown with chain double-dashed line. in FIGS. 1A and 2.

In the axial fan unit 1, the second housing member 33 includes a hollow, approximately cylindrical body. Referring to FIG. 5, an inner surface 331 of the body is disposed radially outside the second impeller 31 to surround it. At axial ends of the body are provided an air-inlet side flange 332 and an air-outlet side flange 333 which are approximately square when seen in the axial direction and each has four corners, as shown in FIGS. 2 and 5. The flanges 332 and 333 are arranged with their outer peripheries coincident with each other when seen in the axial direction.

The shapes of the first and second housing members 23 and 34 are approximately the same as or similar to each other. The outer shape of the air-inlet side flange 332 and that of the air-outlet flange 333 of the second housing member 33 are the same as those of the air-inlet side flange 232 and the air-outlet side flange 233 of the first hosing member 23, respectively, when seen in the axial direction. The second housing member 33 is joined to the first housing member 23 with the outer peripheries of the second air-inlet side flange 332 and the first air-outlet side flange 233 coincident with each other.

In this preferred embodiment, an imaginary quadrangular prism 334 having approximately square axial ends and side surfaces parallel to the center axis J1 is formed by axially connecting the second air-inlet side flange 332 and the second air-outlet side flange 333 to each other, as shown in FIGS. 1A and 2. The side surfaces are shown with chain double-dashed line in FIGS. 1A and 2.

In the axial fan unit 1, each of the first and second axial fans 2 and 3 is provided with a wire guiding structure which enables the wires to extend along one or more side surfaces of the axial fan(s) and be pulled out to the outside of the axial fan unit 1 from one axial side of the axial fan unit 1. Next, the wire guiding structure is described.

Referring to FIGS. 1A and 4, the first housing member 23 is provided with a first guiding portion 235 for guiding the first group of wires 25 connected to the first motor 22 of the first axial fan 2 and a second guiding portion 236 for guiding the second group of wires 35 connected to the second motor 32 of the second axial fan 3. The first guiding portion 235 guides the first group of wires 25, which are pulled out from the path 230 from the air-outlet side (i.e., lower side in FIG. 1A) of the first housing member 23, along the center axis J1 toward the air-inlet side of the first housing member 23. The second guiding portion 236 guides the second group of wires 35, which are pulled out from the path 330 from the air-outlet side of the second housing member 33 and guided to the first housing member 23, along the center axis J1 toward the air-inlet side of the first housing member 23.

In this preferred embodiment, the first and second guiding portions 235 and 236 of the first housing member 23 are provided to sandwich one of four corners 2341 of the imaginary quadrangular prism 234 of the first housing member 23, as shown in FIG. 2. More specifically, the four corners 2341 of the imaginary quadrangular prism 234 extend along the center axis J1. Adjacent to one of those corners 2341, which is labeled with 2341a in order to distinguish it from the remaining corners, the first and second guiding portions 235 and 236 are provided along the center axis J1. The first and second guiding portions 235 and 236 are adjacent to two different surfaces of the corner 2341a, respectively. In FIG. 2, the corner 2341a is located on the near side.

The shape of the second housing member 33 is approximately the same as or similar to that of the first housing member 23, as described above. The second housing member 33 is also provided with third and fourth guiding portions 335 and 336 which are approximately the same or the same in shape and function as the first and second guiding portions 235 and 236 of the first housing member 23, respectively. The third and fourth guiding portions 335 and 336 are adjacent to two different surfaces of the imaginary quadrangular prism 334 which form a corner 3341a, as shown in FIG. 2.

In the first housing member 23, the first guiding portion 235 axially extends between the first air-inlet side flange 232 and the first air-outlet side flange 233. At axial ends of the first guiding portion 235 are formed first receiving portions 2321 and 2331, respectively, each of which can receive one or more wires. In this preferred embodiment, the first receiving portions 2321 and 2331 are formed by indented portions adjacent to outer peripheries of the corresponding flanges 232 and 233, respectively. The indented portion 2321 is partly closed by a portion of the outer peripheral surface of the air-inlet side flange 232. Similarly, the indented portion 2331 is partly closed by a portion of the outer peripheral surface of the air-outlet side flange 233 of the first housing member 23. The portions of the outer peripheral surfaces of the air-inlet side flange 232 and the air-outlet flange 233 serve as restriction portions recited in the claims ad described later.

The second guiding portion 236 axially extends between the first air-inlet side flange 232 and the first air-outlet side flange 233. At axial ends of the second guiding portion 236 are formed second receiving portions 2322 and 2332, respectively, each of which can receive one or more wires therein. In this preferred embodiment, the second receiving portions 2322 and 2332 are also formed by indented portions adjacent to outer peripheries of the flanges 232 and 233, respectively. The indented portion 2322 is partly closed by a portion of the outer peripheral surface of the air-inlet side flange 232. The indented portion 2332 is partly closed by a portion of the outer peripheral surface of the air-outlet side flange 233. Those portions of the outer peripheral surfaces of the flanges 232 and 233, which partly close the indented portions 2322 and 2332 also serve as restriction portions recited in the claims, as described later.

Adjacent to each first or second receiving portion is provided a restriction portion which prevents the group of wires received in the adjacent receiving portion from protruding beyond the outer periphery of the first air-inlet side flange 232 and the first air-outlet side flange 233. More specifically, a hook 2323 is provided adjacent to the indented portion 2321. The hook 2323 has an outer surface formed by a portion of an outer peripheral surface of the first air-inlet side flange 232, thereby preventing the wires in the indented portion 2321 from protruding beyond the outer periphery of the first air-inlet side flange 232. Please note that the outer peripheral surface of the flange is a surface parallel to the center axis J1. Similarly, a hook 2333 is provided adjacent to the indented portion 2331 and has an outer surface formed by a portion of an outer peripheral surface of the first air-outlet side flange 233. Hooks 2324 and 2334 are provided adjacent to the indented portions 2322 and 2332, respectively, in a similar manner to the hooks 2323 and 2333.

As shown in FIGS. 1A and 2, the hooks 2323 and 2324 at the first air-inlet side flange 232 are adjacent to different sides of the outer periphery of the first air-inlet side flange 232, and the hooks 2333 and 2334 at the first air-outlet side flange 233 are adjacent to different sides of the outer periphery of the first air-outlet side flange 233.

In the second housing member 33 having approximately the same shape as or a similar shape to the first housing member 23, indented portions 3321 and 3331 are formed at axial ends of the third guiding portion 335 axially extending, respectively. Similarly, indented portions 3322 and 3332 are provided at axial ends of the fourth guiding portion 336, respectively. The indented portions 3321 and 3331 of the third guiding portions 336 open on outer peripheries of the second air-inlet side flange 332 and the second air-outlet side flange 333, respectively. Hooks 3323 and 3333 as restriction portions for restricting protrusion of wires beyond the outer peripheries of the flanges 332 and 333 are provided adjacent to the indented portions 3321 and 3331, respectively. Also, the indented portions 3322 and 3332 of the fourth guiding portion 336 open on the outer peripheries of the second air-inlet side flange 332 and the second air-outlet side flange 333, respectively. Hooks 3324 and 3334 are provided adjacent to the indented portions 3322 and 3332, respectively.

At least one rib 26 extending axially is provided between the first air-inlet side flange 232 and the first air-outlet side flange 233 of the first housing member 23 on an outer surface of the body of the first housing member 23 in which an approximately cylindrical hollow. In this preferred embodiment, two ribs 26 are provided, as shown in FIGS. 1A and 2. However, the number of the ribs 26 is not specifically limited, as long as at least one rib 26 is provided. The rib 26 is provided for the following reason. In this preferred embodiment, the indented portions 2321 and 2322 are formed at the first air-inlet side flange 232. Thus, the cross-sectional area of connection between the corner 2341a of the first air-inlet side flange 232 and the outer surface of the hollow body of the first housing member 23 when seen in the axial direction is smaller, as compared with the other corners 2341. This means that when a load is axially applied to the first air-inlet side flange 232, the first air-inlet side flange 232 can be easily broken at this connection. In order to prevent such breakage, at least one rib 26 is provided, which enhances the strength against the load axially applied to the first air-inlet side flange 232. That is, strength reliability is increased. At the same time, the strength of the first air-outlet side flange 233 against an axially applied load applied thereto can be enhanced by providing at least one rib 26.

The second housing member 33 also include at least one rib 36 axially extending on the outer surface of the hollow body of the second housing member 33 between the air-inlet side flange 332 and the air-outlet side flange 333, as in the first housing member 23. The number of ribs 36 is specifically limited although two ribs 36 are provided in this preferred embodiment. The rib 36 enhances the strength of the second air-inlet side flange 332 and that of the second air-outlet side flange 333 against an axially applied load as with the rib 26.

Referring to FIG. 1A, in the axial fan unit 1, the first group of wires 25 are pulled out from the inside of the first housing member 23, pass through the indented portion 2331 formed in the first air-outlet side flange 233, and extend parallel to the center axis J1 along the first guiding portion 235 between the outer surface of the hollow body of the first housing member 23 and the side surface of the imaginary quadrangular prism 24 toward the first air-inlet side flange 232. After passing through the indented portion 2321 at the first air-inlet side flange 232, the first group of wires 25 are pulled out to the outside of the axial fan unit 1 from the air-inlet side of the first housing member 23 (i.e., the side of the first housing member 23 opposite to the second housing member 33). That is, the indented portion 2321 serves as a wire-outlet port via which the first group of wires 265 are pulled out to the outside of the axial fan unit 1.

The hooks 2333 and 2323 adjacent to the indented portions 2331 and 2321 catch the first group of wires 25 at the first air-outlet side flange 2333 and the first air-inlet side flange 2323, respectively.

Similarly, the second group of wires 35 are pulled out from the inside of the second housing member 33, pass through the indented portion 3332 formed in the second air-outlet side flange 333, and axially extend along the fourth guiding portion 336 between the outer surface of the hollow body of the second housing member 33 and the side surface of the imaginary quadrangular prism 334. After passing through the indented portion 3322 at the second air-inlet side flange 332, the second group of wires 26 are pulled out to the first housing member 23.

Then, the second group of wires 35 pass through the indented portion 2332 of the first air-outlet side flange 233. Please note that both the indented portion 3322 and 2332 are joined together to form a single continuous hole. After passing through this single continuous hole, the second group of wires 26 extend along the second guiding portion 236 between the outer surface of the hollow body of the first housing member 23 and the side surface of the imaginary quadrangular prism 234 in a direction in which the first group of wires 25 extend and which is parallel to the center axis J1. The second group of wires 26 then pass through the indented portion 2322 of the first air-inlet side flange 232 so as to be pulled out from the air-inlet side of the first housing member 23. That is, the indented portion 2322 formed in the first air-inlet side flange 232 of the first housing member 23 serves as a wire-outlet port for the second group of wires 35.

In the fourth guiding portion 336 of the second housing member 33, the hooks 3334 and 3324 adjacent to the indented portions 3332 and 3332 catch the second group of wires 35 at the second air-outlet side flange 333 and the second air-inlet side flange 332, respectively. In the second guiding portion 236 of the first housing member 23, the hooks 2334 and 2324 adjacent to the indented portions 2332 and 2322 catch the second group of wires 35 at the first air-outlet side flange 233 and the first air-inlet side flange 232, respectively.

The first and second groups of wires 25 and 35 are pulled out from the indented portions 2321 and 2322 formed in the first air-inlet side flange 232, respectively, as described above, and are then bound into one group with a binding member 5 on the opposite side of the first housing member 23 to the second housing member 23. In the shown example, all wires are bound into one group axially above the first housing member 23, as shown in FIG. 1A. Examples of the binding member 5 are a heat-shrinkable tape, a binding band, and a binding tape.

As described above, in the axial fan unit 1 of this preferred embodiment, the first group of wires 25 connected to the first motor 22 and the second group of wires 35 connected to the second motor 32 are guided parallel to the center axis J1 between the outer surface of the hollow body of the first housing member 23 and the side surface of the imaginary quadrangular prism 234 and are then brought out to the outside from the air-inlet side of the first housing member 23.

If the first group of wires 25 and the second group of wires 35 are guided together between the outer surface of the hollow body of the first housing member 23 and the side surface of the imaginary quadrangular prism 234 by the aid of a single guiding portion, instead of the first and second guiding portions 235 and 236, the single guiding portion has to have a relatively large size in order to receive all wires of the two groups of wires (at least six wires in this preferred embodiment). Thus, it is necessary to reduce the inner diameter of the hollow body of the first housing member 23, or increase the dimension of the imaginary quadrangular prism 234 in the radial direction, or reduce the diameter of each wire in the first and second group of wires 25 and 35.

To the contrary, the first housing member 23 in the axial fan unit 1 of this preferred embodiment is provided with the first and second guiding portions 235 and 236 for allowing the first group of wires 25 and the second group of wires 35 to axially extending along the outer surface of the hollow body of the first housing member 23 on a center-axis side of the side surface of the imaginary quadrangular prism 234. Thus, it is possible to allow the first and second groups of wires 25 and 35 to axially extend without reducing the inner diameter of the hollow body of the first housing member 23 (i.e., the diameter of the path 230 inside the first housing member 23) and increasing the dimension of the imaginary quadrangular prism 234 in the radial direction. Moreover, it is not necessary to reduce the diameter of each wire in the first and second groups of wires 25 and 35. Therefore, large current can be supplied to the first and second motors 22 and 32. Thus, the axial fan unit 1 can be rotated at high speed and bear a high static pressure.

In the first housing member 23, the first and second guiding portions 235 and 236 are provided near two different side faces forming the corner 2341a of the imaginary quadrangular prism 234. The first and second receiving portions in each flange are provided adjacent to two different sides of the outer periphery of that flange. Thus, both the first and second groups of wires 25 and 35 are arranged at or near a single corner 2341a. This simplifies the structure of the axial fan unit 1 and can reduce the possibility that wires are caught by other components or the like when the axial fan unit 1 is installed into an electronic device. Therefore, handling of the axial fan unit 1 can be made easier. Moreover, with this configuration, it is possible to suppress interference of the first and second groups of wires 25 and 35 with other components in the electronic device. This increases the degree of freedom of arranging the axial fan unit 1 in the electronic device.

In the axial fan unit 1, the first and second groups of wires 25 and 35 are bound into one group with the binding member 5. This makes handling of the axial fan unit 1 further easier. Also, arrangement of the first and second groups of wires 25 and 35 in the electronic device can be made easier.

In the first housing member 23, the hooks 2323 and 2324 are provided at the first air-inlet side flange 232 to be adjacent to the first and second receiving portions 2321 and 2322 so as to prevent the first and second groups of wires 25 and 35 from protruding beyond the outer periphery of the first air-inlet side flange 232, respectively. Thus, the first and second groups of wires 25 and 35 can be reliably caught on a center-axis side of the outer periphery of the first air-inlet side flange 232, i.e., between the outer surface of the hollow body of the first housing member 23 and the side surfaces of the imaginary quadrangular prism 234. Moreover, also at the first air-outlet side flange 233, the hooks 2333 and 2334 are provided adjacent to the first and second receiving portions 2331 and 2332 so as to prevent the first and second groups of wires 25 and 35 from protruding beyond the outer periphery of the first air-outlet side flange 233, respectively. The hooks 2333 and 2334 can further improve the reliability of catching the first and second groups of wires 25 and 35 on the center-axis side of the outer peripheries of the flanges.

The first and second groups of wires 25 and 35 are pulled out to the outside of the first housing member 23 from the first air-inlet side flange 232. With this configuration, turbulence of an air flow discharged from the axial fan unit 1 can be prevented, as compared with a case where the first and second groups of wires 25 and 35 are pulled out from the air-out side end 233. Thus, undesirable wind noise can be prevented.

The first and second housing members 23 and 33 can be formed by using a single mold when having the same shape as each other. Thus, it is possible to easily manufacture the axial fan unit 1 and reduce the manufacturing cost.

In this preferred embodiment, each housing member is provided with two guiding structures for two groups of wires, respectively. This is advantageous in that the wire-outlet side of the axial fan unit 1 from which the first and second groups of wires 25 and 35 are pulled out to the outside of the axial fan unit 1 can be changed depending on how and where to place the axial fan unit 1 in an electronic device, or the like. That is, in the axial fan unit 1 of this preferred embodiment, it is possible to bring the first and second groups of wires 25 and 35 from a desired one of the first housing member 23 side and the second housing member 33 side.

Figure 1B:
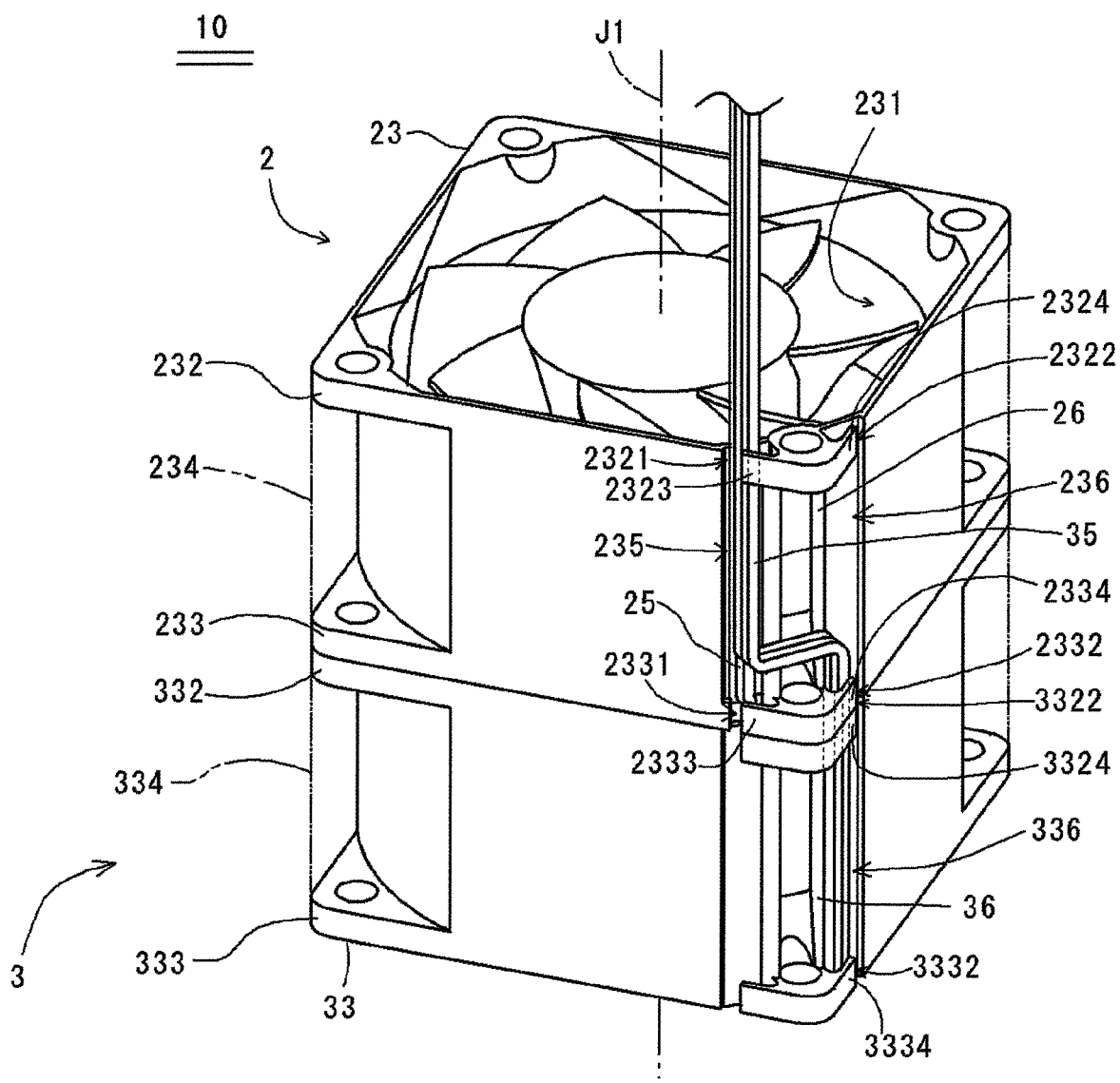
FIG. 1B shows an exemplar modification of the axial fan unit of FIG. 1A.

FIG. 1B is a perspective view of an exemplary modification of the axial fan unit according to the first preferred embodiment. If the number of wires in each group of wires 25 or 35 is small (e.g., 2 or 3) or the diameter of each wire is small, both the first and second groups of wires 25 and 35 may be guided by a single guiding portion. Except for that point, the axial fan unit 10 of this modified example is basically the same as the axial fan unit 1 of the first preferred embodiment. Therefore, like parts are given like reference numerals in FIGS. 1A and 1B, and detailed description thereof is omitted here.

In this axial fan unit 10, the first group of wires 25 are pulled out from the indented portion 2331 of the first air-outlet side flange 233 of the first housing member 23, extend along the first guiding portion 235 between the outer surface of the hollow body of the first housing member 23 and the side surface of the imaginary quadrangular prism 234. After passing through the indented portion 2321 of the first air-inlet side flange 232, the first group of wires 25 are pulled out to the outside of the axial fan unit 10 on the air-inlet side of the first housing member 23 (i.e., the opposite side to the second housing member 33). That is, the indented portion 2321 serves as a wire-outlet port from which the first group of wires 25 are pulled out to the outside.

Adjacent to the indented portions 2331 and 2321 are provided the hooks 2333 and 2323, respectively. With the hooks 2333 and 2323, the indented portions 2331 and 2321 can catch the first group of wires 25 on the center-axis side of the outer peripheries of the first air-outlet side flange 233 and the first air-inlet side flange 232.

The second group of wires 35 are pulled out through the indented portion 3332 of the second air-outlet side 333 of the second housing member 33, are guided by the fourth guiding portion 336 parallel to the center axis J1 between the outer surface of the hollow of the second housing member 33 (see FIG. 5) and the side surface of the imaginary quadrangular prism 334. After passing through the indented portion 3322 provided at the second air-inlet side flange 332, the second group of wires 35 are guided to the first housing member 23.

The second group of wires 35 then pass through the indented portion 2332 provided at the first air-outlet side flange 233 which is coincident with the indented portion 3322 provided at the second air-inlet side flange 332 when seen in the axial direction. After passing through the indented portion 2332, the second group of wires 35 axially extend along the second guiding portion 236 for a while between the outer surface of the hollow body the first housing member 23 and the side surface of the imaginary quadrangular prism 234. That is, the second group of wires 35 are pulled out in the same direction as the first group of wires 25. Then, at a position on the air-inlet side (the axially upper side in FIG. 1B) of the first air-outlet side flange 233, the pull-out direction of the second group of wires 35 is changed so that thereafter the second group of wires 35 are guided by the first guiding portion 235. That is, the first and second groups of wires 25 and 35 are joined together on the air-inlet side of the first air-outlet side flange 233 of the first housing member 23. The first and second groups of wires 25 and 35 are then guided by the first guiding members 25 parallel to each other, pass through the indented portion 2323 of the first air-inlet side flange 232, and are pulled out to outside of the axial fan unit 10 from the air-inlet side of the first housing member 23 (i.e., the opposite side to the second housing member 33). In the first housing member 23, the indented portion 2323 serves as a port from which the second group of wires 35 are pulled out to the outside.

In the fourth guiding portion 336 of the second housing member 33, the indented portions 3332 and 3322 are provided with the hooks 3334 and 3324. The hooks 3334 and 3324 prevent the second group of wires 35 from protruding beyond the outer peripheries of the second air-outlet side flange 333 and the second air-inlet side flange 332, respectively. In the second guiding portion 235 of the first housing member 23, the indented portion 2332 is provided with the hook 2334. The hook 2334 prevents the second group of wires 35 from protruding beyond the outer periphery of the first air-outlet side flange 233 of the first housing member 23.

As described above, which of the first, second, third, and fourth guiding portions 235, 236, 335, and 336 is used for guiding the first and second groups of wires 25 and 35 is determined depending on how to arrange or use the axial fan unit in an electronic device. The first group of wires 25 and the second group of wires 35 may be pulled out to the outside of the axial fan unit independently of each other but not together. Alternatively, the first and second groups of wires 25 and 35 may be joined together at any axial position before finally being pulled out to the outside of the axial fan unit.

Second Preferred Embodiment

An axial fan unit according to a second preferred embodiment of the present invention is now described. The axial fan unit of the second preferred embodiment is the same as that shown in FIGS. 1A and 2 to 5, except for the structure of guiding portions for guiding the first and second groups of wires. Thus, like parts are given like reference numerals in the drawings, and the description thereof is omitted.

Figure 6:
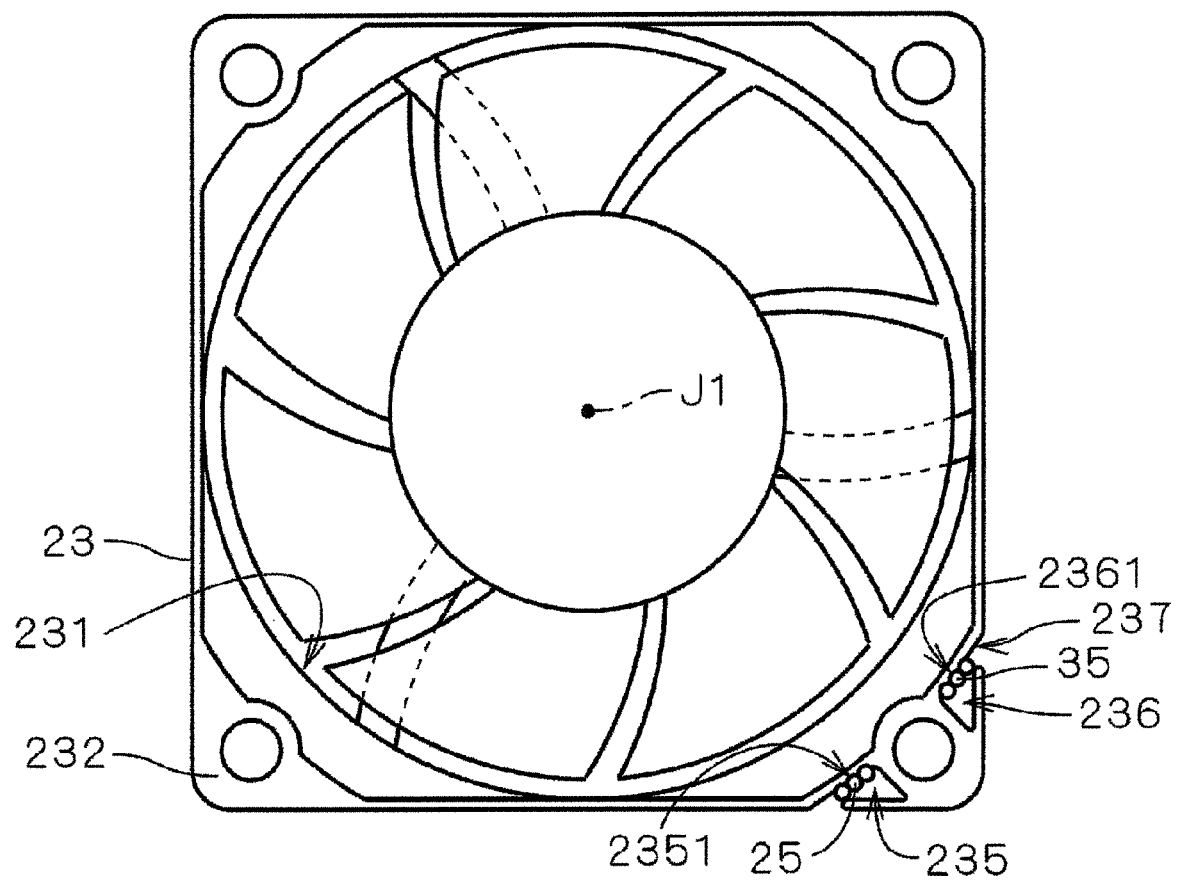
FIG. 6 is a plan view of a first axial fan in an axial fan unit according to a second preferred embodiment of the present invention.
Figure 7:
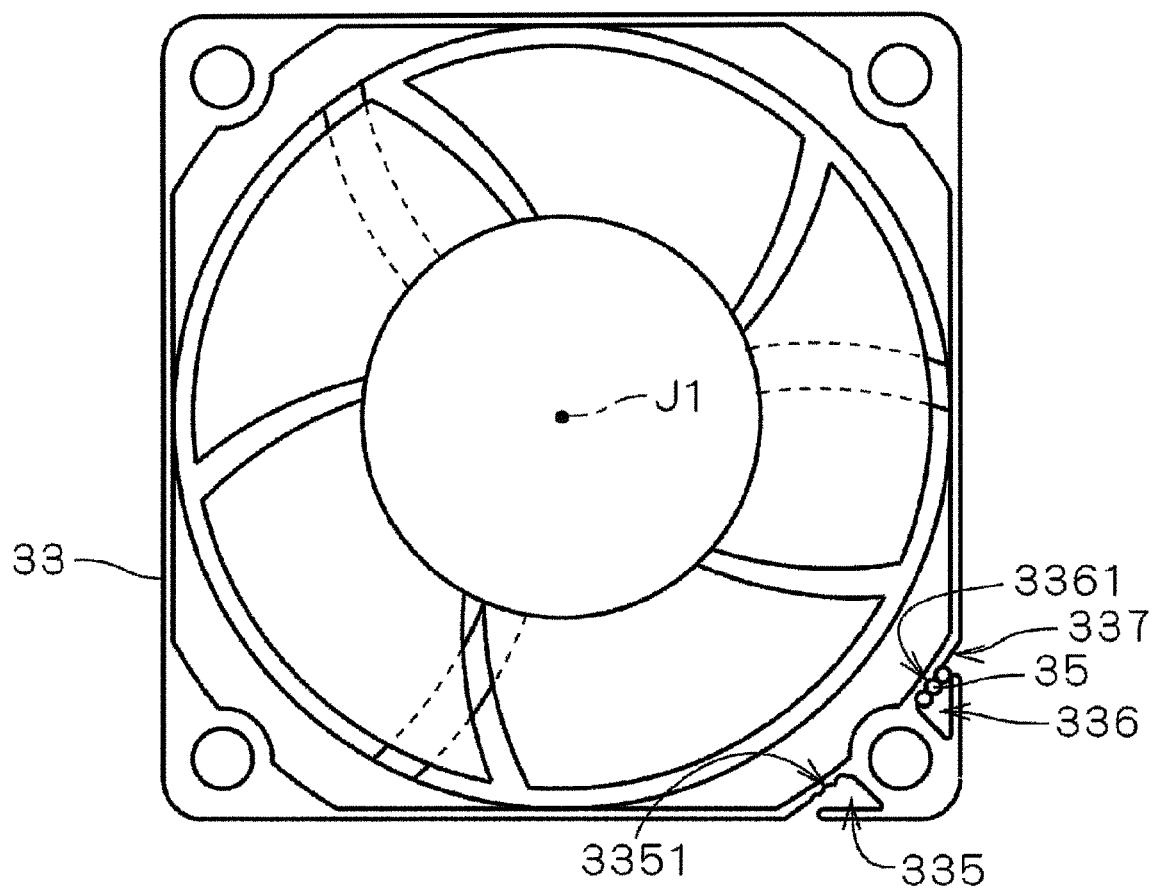
FIG. 7 is a plan view of a second axial fan in the axial fan of FIG. 6.

FIGS. 6 and 7 are plan views of the first and second axial fans 2 and 3 included in the axial fan unit of the second preferred embodiment.

As shown in FIG. 6, the first guiding portion 235 and the second guiding portion 236 are provided with one or more first guiding grooves 2351 and one or more second guiding grooves 2361, respectively. Each guiding groove is formed on an outer surface 237 of the hollow body of the first housing member 23 along the center axis J1 between the first air-inlet side flange 232 and the first air-outlet side flange 233. In each of the first and second receiving portions of the first housing member 23, the guiding grooves are located on a center-axis side surface. Similarly, the third guiding portion 335 and the fourth guiding portion 336 are provided with one or more third guiding grooves 3351 and one or more fourth guiding grooves 3361, respectively. Each guiding groove is formed on the outer surface 337 of the hollow body of the second housing member 33, as shown in FIG. 7, and extends parallel to the center axis J1 between the second air-inlet side flange 332 and the second air-outlet side flange 333. In each of the third and fourth receiving portions of the second housing member 33, the guiding grooves are located on a center-axis side surface.

In this preferred embodiment, three guiding grooves are provided in each guiding portion. However, the number of guiding grooves in each guiding portion is not limited thereto. When a single guiding groove is formed in each guiding portion, it is preferable that the single guiding groove be relatively wide or have such a size that all wires passing through that guiding portion 2351 can be received in the single guiding groove.

In the axial fan unit of the second preferred embodiment, the first group of wires 25 are guided by the first guiding grooves 2351 in the first guiding portion 235 parallel to the center axis J1. The second group of wires 35 are guided by the fourth guiding grooves 3361 in the fourth guiding portion 336 of the second housing member 33 and the second guiding grooves 2361 in the second guiding portion 236 of the first housing member 23, parallel to the center axis J1.

In this preferred embodiment, the first housing member 23 is provided with the first and second receiving portions and the first and second restriction portions for guiding the first and second groups of wires 25 and 35 independently of each other at the first air-inlet side flange 232 and the first air-outlet side flange 233, as in the first preferred embodiment. Thus, it is possible to allow the first and second groups of wires 25 and 35 to extend along the center axis J1 without reducing the inner diameter of the hollow body of the first housing member 23 and increasing the dimension of the imaginary quadrangular prism 234 in the radial direction.

In the first housing member 23 of this preferred embodiment, due to the first and second guiding grooves 2351 and 2361, the first and second groups of wires 25 and 35 can be guided to the air-inlet side flange 232 more reliably. Similarly, in the second housing member 33, due to the third and fourth guiding grooves 3351 and 3361, the second group of wires 35 can be guided to the first housing member 23 more reliably. Moreover, due to those guiding grooves 2351, 2361, 3351, and 3361, it is possible to more reliably prevent the first and second groups of wires 25 and 35 from protruding outside the imaginary quadrangular prisms 234 and 334 (see FIG. 1A) of the first and second housing member 23 and 33. Thus, contact of the first and second groups of wires 25 and 35 with another component or the like in an electronic device into which the axial fan unit of this preferred embodiment is installed can be more reliably prevented.

Third Preferred Embodiment

Figure 8:
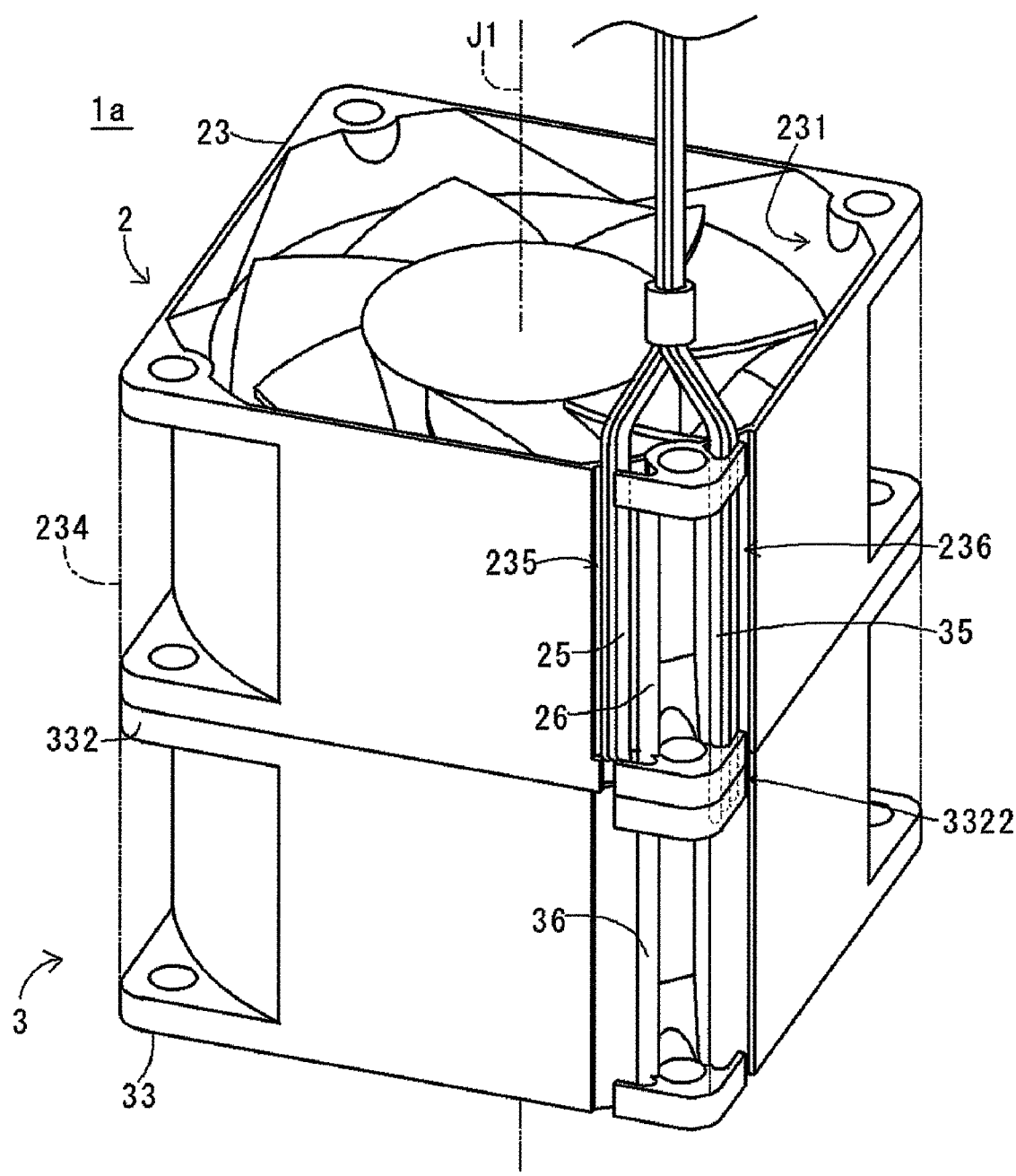
FIG. 8 is a perspective view of an axial fan unit according to a third preferred embodiment of the present invention.
Figure 9:
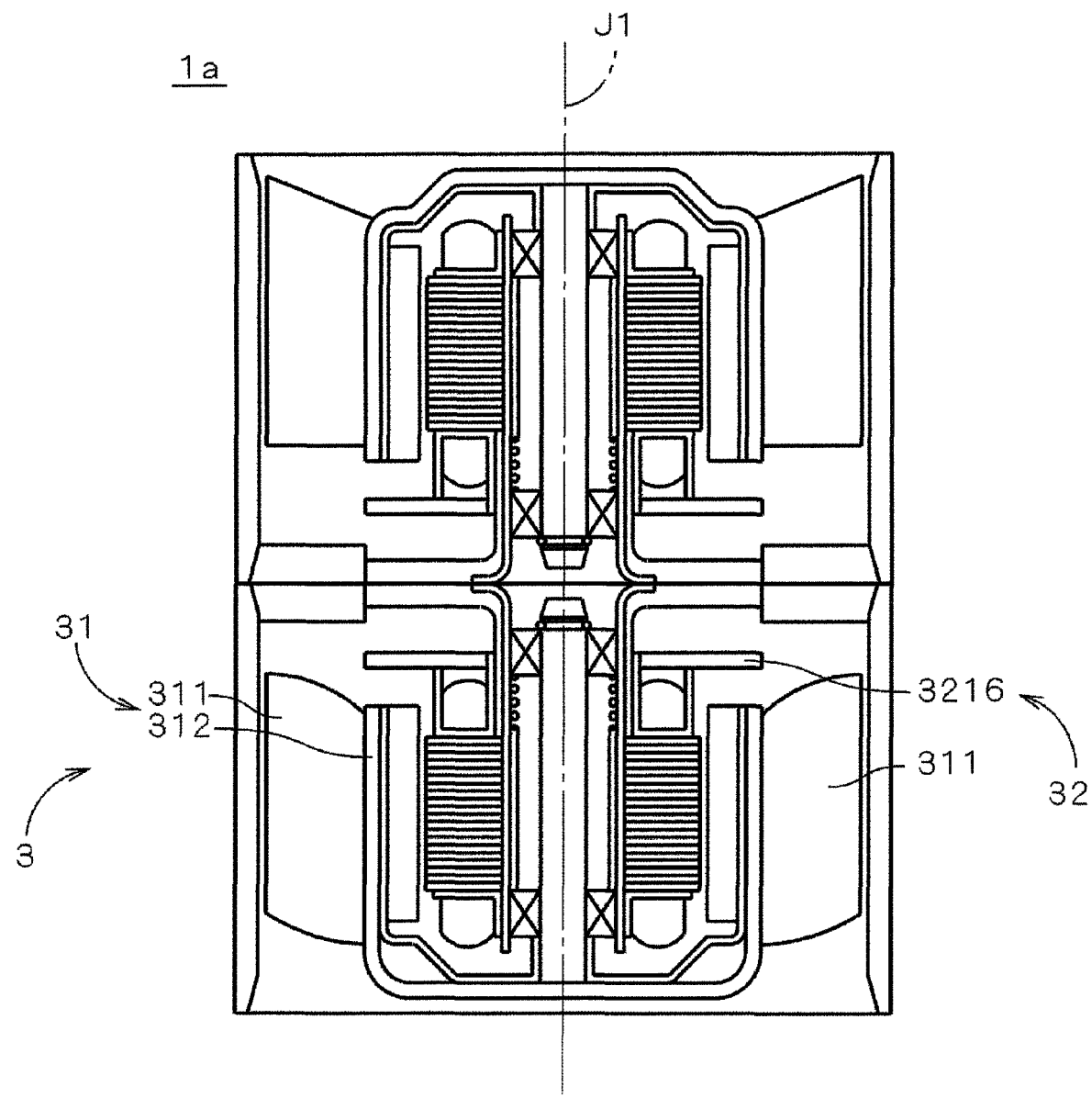
FIG. 9 is a cross-sectional view of the axial fan unit of FIG. 8.

An axial fan unit according to a third preferred embodiment of the present invention is now described, referring to FIGS. 8 and 9. FIG. 8 is a perspective view of an axial fan unit 1a of this preferred embodiment. FIG. 9 is a cross-sectional view of the axial fan unit 1a, taken along a plane including the center axis J1. The axial fan unit 1a has the same structure as the axial fan unit 1 of the first preferred embodiment shown in FIGS. 1A and 2 to 5, except for the following. In FIGS. 8 and 9, like parts are given like reference numerals.

As is apparent from the comparison between FIGS. 3 and 9, the axial fan unit 1a of this preferred embodiment is different from the axial fan unit 1 of the first preferred embodiment in the orientation of the second motor 32 and the orientation of the hub 312 of the second impeller 32. The orientation of the second blades 311 of the second impeller 31 in this preferred embodiment is the same as that in the first preferred embodiment.

In the axial fan unit 1a, the circuit board 3216 of the second motor 32 is arranged near the air-inlet side end of the second axial fan 3. Thus, the second group of wires 35 are pulled out via a indented portion 3322 provided at the second air-inlet side flange 332 of the second housing member 33, as shown in FIG. 8. The second group of wires 35 are guided by the second guiding portion 236 between the outer surface of the hollow body of the first housing member 23 of the first axial fan 2 and the side surface of the imaginary quadrangular prism 234, parallel to the center axis J1 and are finally pulled out from the air-inlet end side of the first housing member 23 to the outside of the axial fan unit 1a.

In the axial fan unit 1a, the first housing member 23 is provided with the indented portions for enabling the first group of wires 25 and the second group of wires 35 to axially extend independently of each other between the outer surface of the hollow body of the first housing member 23 and the side surface of the imaginary quadrangular prism 234, as in the first preferred embodiment. Thus, it is possible to guide the first and second groups of wires 25 and 35 parallel to the center axis J1 without reducing the inner diameter of the hollow body of the first housing member 23 and making the size of the imaginary quadrangular prism 234 of the first housing member 23 larger. Moreover, the hooks as the first and second restriction portions are also provided in the first housing member 23 in this preferred embodiment. Thus, it is possible to pull the first and second groups of wires 25 and 35 without allowing them to protrude beyond the outer peripheries of the air-inlet side flange 232 and the air-outlet side flange 233 more reliably.

Fourth Preferred Embodiment

Figure 10:
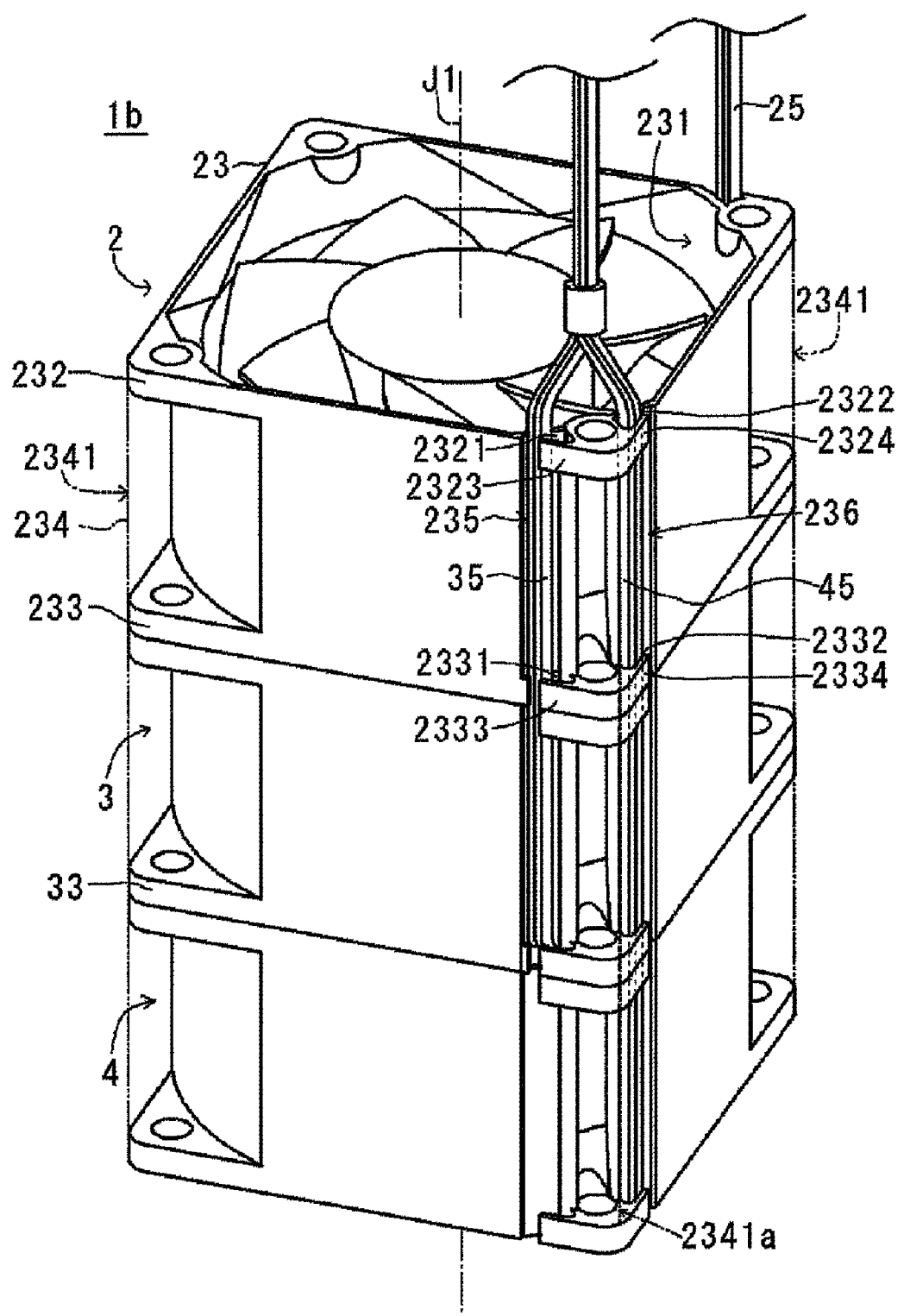
FIG. 10 is a perspective view of an axial fan unit according to a fourth preferred embodiment of the present invention.

An axial fan unit according to a fourth preferred embodiment of the present invention is now described, referring to FIG. 10. FIG. 10 is a perspective view of the axial fan unit 1a of this preferred embodiment.

As shown in FIG. 10, the axial fan unit 1b includes the first and second axial fans 2 and 3 shown in FIG. 1A and also includes a third axial fan unit 4 coaxially arranged with the first and second axial fans 2 and 3. The third axial fan 4 is connected to the second axial fan 3 and is arranged axially below the second axial fan in FIG. 10. Each of the axial fans 2, 3, and 4 has two guiding structures capable of guiding two groups of wires independently of each other which are the same as those provided in the first and second axial fans 2 and 3 of the first preferred embodiment. In addition, at least the first axial fan 1 is provided with another guiding structure capable of guiding another group of wires adjacent to a different corner 2341 of the imaginary quadrangular prism 234 from the corner 2341a to which the first and second guiding structures (including the indented portions 2321, 2322, 2331, and 2332 and the hooks 2323, 2324, 2333, and 2334). Except for those points, the axial fan unit 1b is the same as the axial fan unit 1 of the first preferred embodiment. Thus, like parts are given like reference numerals, and the detailed description thereof is omitted here.

The third axial fan 4 has approximately the same structure as those of the first and second axial fans 2 and 3 shown in FIG. 3, except for the housing structure. In this preferred embodiment, the impellers of the first, second, and third axial fans 2, 3, and 4 are rotated in the same direction as one another.

In the axial fan unit 1b, the first housing member 23 of the first axial fan 2 is provided with the indented portions 2321 and 2331 and the hooks 2323 and 2333 adjacent to the indented portions 2321 and 2331, and the indented portions 2322 and 2332 and the hooks 2324 and 2334 adjacent to the indented portions 2322 and 2332, as in the first preferred embodiment. The indented portions 2321, 2322, 2331, and 2332 are provided in the flanges 232 and 233 on the center-axis side of the outer peripheries of the flanges 232 and 233. Each of the hooks 2323, 2324, 2333, and 2334 has an outer surface formed by a portion of the outer peripheral surface of the corresponding flange. With this configuration, the first housing member 23 can allow two groups of wires to axially extend with preventing them from protruding beyond the outer peripheries of the flanges 232 and 233.

In addition, the first housing member 23 of the first axial fan 2 is provided with other indented portions and other hooks adjacent to the indented portions at the air-inlet side flange 232 and the air-outlet side flange 233. As shown in FIG. 10, the other indented portions and the other hooks associated therewith are provided adjacent the corner 2341 of the imaginary quadrangular prism 234 which is different from the corner 2341a near which the indented portions 2321, 2322, 2331, 2332 and the hooks 2323, 2324, 2333, and 2334 are provided. That is, the first housing member 23 has three guiding structures for allowing three groups of wires to axially extend with preventing protrusion of them beyond the outer peripheries of the flanges 232 and 233.

The structure of the housing members of the second and third axial fans 3 and 4 may be the same as the first housing member 23 of the first axial fan 2, or may be different. When the housing members of the second and third axial fans 3 and 4 have the same structure as the first housing member 23, they can be formed by using the same mold as the first housing member 23. Thus, the manufacturing efficiency can be improved.

In the axial fan unit 1*b*, the first and second guiding portions 235 and 236 of the first housing member 23 of the first axial fan 2 are used for guiding the second group of wires 35 connected to the second motor 32 (see FIG. 3) of the second axial fan 3 and the third group of wires 45 connected to the motor of the third axial fan 4, respectively. The first group of wires 25 pulled out from the inside of the first housing member 23 are guided by the other guiding portion.

More specifically, the second group of wires 35 are pulled out from the inside of the housing member of the second axial fan 3, and axially extend upward in FIG. 10 while passing through the indented portions. From the indented portion 2321, the second group of wires 35 are pulled out to the outside of the axial fan unit 1*b*. The second group of wires 35 are prevented from protruding beyond the outer peripheries of the flanges of the axial fans 2, 3 and 4 by the indented portions 2321 and 2331 and corresponding indented portions of the housing members of the second and third axial fans 3 and 4, and the hooks 2323 and 2333 and corresponding hooks. Similarly, the third group of wires 45 are pulled out from the inside of the housing member of the third axial fan 4, axially extend upward in FIG. 10, and are pulled out to the outside from the indented portion 2322. The indented portions 2322 and 2332 and corresponding indented portions of the housing members of the second and third axial fans 3 and 4 and the hooks 2324 and 2334 and corresponding hooks prevent the third group of wires 45 from protruding beyond the outer peripheries of the flanges of the axial fans 2, 3 and 4.

With this configuration, three groups of wires can be pulled out to the outside of the axial fan unit without protruding beyond the outer peripheries of the flanges. This configuration does not require reduction in the inner diameter of the hollow body of the housing member of each axial fan nor increase in the size of each flange in the radial direction perpendicular to the center axis J1.

Fifth Preferred Embodiment

Figure 11:
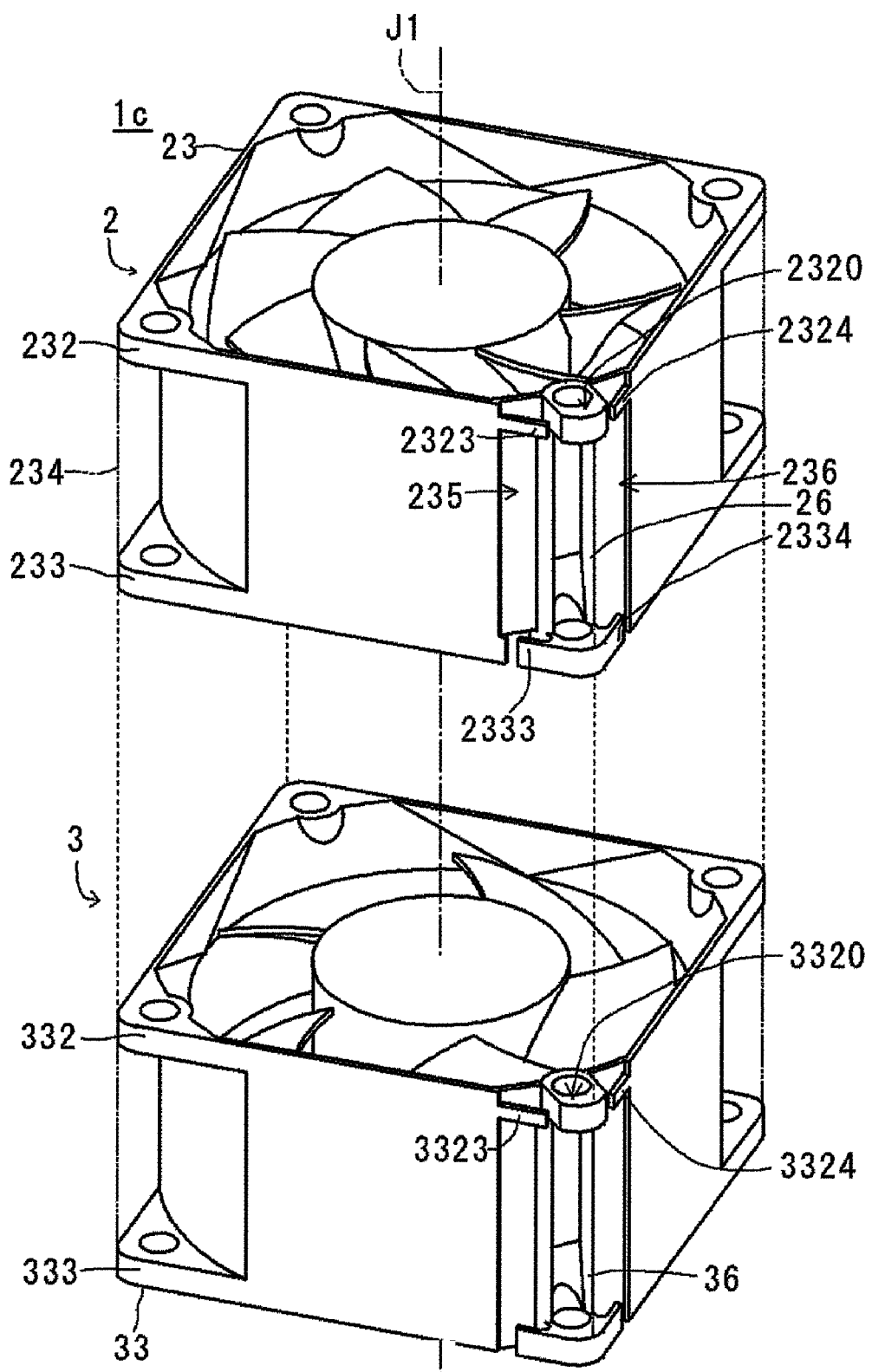
FIG. 11 is an exploded perspective view of an axial fan unit according to a fifth preferred embodiment of the present invention.
Figure 12:
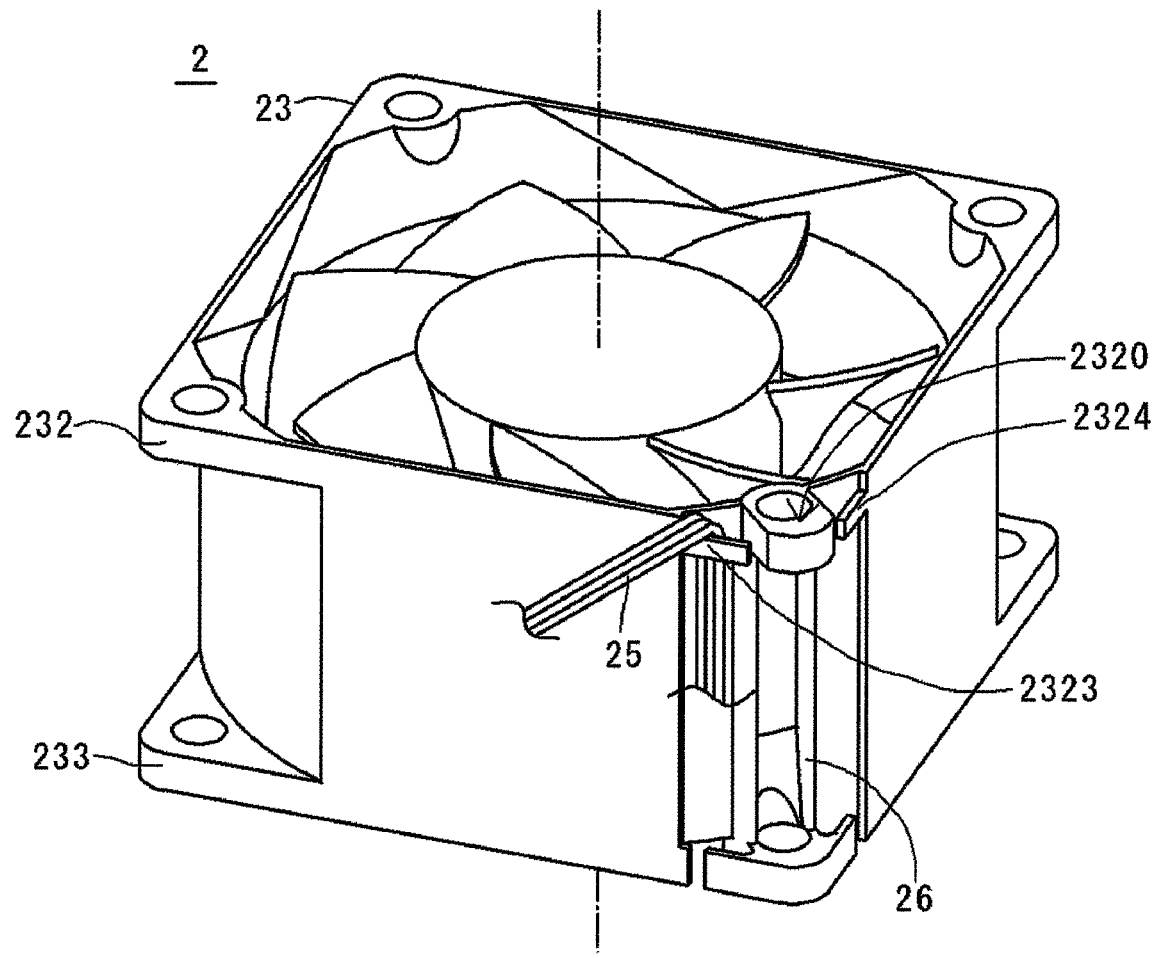
FIG. 12 is a perspective view of a first axial fan in the axial fan unit of FIG. 11.

An axial fan unit according to a fifth preferred embodiment is now described, referring to FIGS. 11 and 12. FIG. 11 is an exploded perspective view of the axial fan unit 1*c* of this preferred embodiment. FIG. 12 is a perspective view of the first axial fan 2 of the axial fan unit 1*c*.

The axial fan unit 1*c* has the same structure as that of the axial fan unit 1 of the first preferred embodiment shown in FIGS. 1*a* and 2 to 5, except for the arrangement of hooks for catching wires. Like parts are given like reference numerals in the drawings and the detailed description thereof is omitted here. For the sake of convenience, in FIG. 11, the groups of wires pulled out from the first axial fan 2 and the second axial fan 3 are omitted. In FIG. 12, only a part of the first group of wires 25 pulled out from the first axial fan 2 is shown but the group of wires pulled out from the second axial fan 3 (see FIG. 11) are omitted.

As shown in FIG. 11, in the axial fan unit 1*c*, the hooks 2323 and 2324 provided at the first air-inlet side flange 232 of the first housing member 23 and the hooks 3323 and 3324 provided at the second air-inlet side flange 332 of the second housing member 33 are arranged at positions different from those in the axial fan unit 1 of the first preferred embodiment.

The hooks 2323 and 2324 are arranged apart from the air-inlet side end of the first air-inlet side flange 232 of the first housing member 23 downward in the axial direction in FIG. 11. Similarly, the hooks 3323 and 3324 of the second housing member 33 are arranged apart from the air-inlet side end 3320 of the second air-inlet side flange 332 downward in the axial direction in FIG. 11. Although the arrangement of the hooks in the axial faun unit 1*c* of this preferred embodiment is different from that in the first preferred embodiment, the first and second groups of wires 25 and 35 are pulled out to the outside of the axial fan unit 1*c* in a similar manner to that described in the first preferred embodiment.

In the axial fan unit 1*c*, the first guiding portion 235 and the second guiding portion 236 enable the first group of wires 25 (see FIG. 12) and the second group of wires 35 (see FIG. 1A) to be guided along the center axis J1 without reducing the inner diameter of the hollow body of the first housing member 23 and increasing the size of the imaginary quadrangular prism 234 larger, as in the first preferred embodiment. Moreover, the hooks 2323, 2333, 2324, 2334 can reliably catch the first and second groups of wires 25 and 35, as in the first preferred embodiment.

As shown in FIG. 12, the hook 2323 of the first guiding portion 235 is arranged apart from the air-inlet side end 2320 of the first air-inlet side flange 232 of the first housing member 23. Thus, the first group of wires 25 can be pulled out to the outside from the first housing member 23 at a position axially below the air-inlet side end 2320 of the first housing member 23. Also, the hook 2324 is arranged apart from the air-inlet side end 2320 of the first housing member 23. Thus, the second group of wires 35 (see FIG. 1A) can be also pulled out from the first housing member 23 at a position axially below the air-inlet side end 2320.

Accordingly, even if the axial fan unit 1*c* has to be installed into an electronic device with the air-inlet side end 2320 of the first housing member 23 in contact with a casing or another component, it is possible to easily arrange the first and second groups of wires 25 and 35 without preventing contact of the first and second groups of wires 25 and 35 with the casing or the other component.

Other Modifications

The preferred embodiments of the present invention have been described above. However, the present invention is not limited thereto but can be modified in various ways.

For example, in the axial fan units of the first, second, third, and fifth preferred embodiments, the first impeller 21 of the first axial fan 2 and the second impeller 31 of the second axial fan 3 may be rotated in the same direction as each other.

In the axial fan unit 1*b* of the fourth preferred embodiment of the present invention, four or more axial fans may be arranged coaxially with one another. In this case, the number of guiding structures may be increased in accordance with the number of groups of wires (i.e., the number of the axial fans coaxially arranged).

The number of guiding structures provided in each housing member is determined depending on the manner of bringing wires to the outside of the axial fan unit, and may be any number as long as it is equal to or more than the number of wire groups which are separately arranged from each other. For example, in the axial fan units of the first, second, third, and fifth preferred embodiments, the first housing member 23 has to have at least two guiding structures for guiding the first and second groups of wires 25 and 35 independently of each other, whereas one guiding structure guiding the second group of wires 35 is enough for the second housing member 33. In the fourth preferred embodiment, it is only necessary that the housing member of the third axial fan 4 have a single guiding structure.

Furthermore, each of those axial fan units may be modified in such a manner that the first axial fan 2 is located on the air-outlet side of the axial fan unit, not on the air-inlet side, by modifying the blade shape, blade arrangement, and rotating direction of the impeller.

In the axial fan unit 1 of the first preferred embodiment, the hollow body of the first housing member 23 between the first air-inlet side flange 232 and the first air-outlet side flange 233 defines an approximately square hollow as seen along the center axis J1. In this case, two guiding grooves for guiding the first and second groups of wires 25 and 35 are formed on the outer side surface of the first housing member 23. That is, when the first housing member 23 is designed, it is only necessary that the first housing member 23 has an approximately square cross section at least at both axial ends, as seen in the axial direction. This is the same in the second housing member 33.

The first and second guiding portions 235 and 236 of the first housing member 23 may be provided adjacent to different two corners 2341 of the imaginary quadrangular prism 234, respectively. Even in this case, it is possible to guide two groups of wires along the center axis J1 without reducing the inner diameter of the first housing member 23 and making the size of the imaginary quadrangular prism 234 larger.

In the axial fan units of the aforementioned preferred embodiments, the hooks of the first housing member 23 for catching two groups of wires are not provided on both the air-inlet side and the air-outlet side of each of the first and second guiding portions 235 and 236. That is, the hook may be provided at one of the air-inlet side flange and the air-outlet side flange as long as such a hook can catch the associated group of wires reliably. Moreover, from the viewpoint of catching two groups of wires, each of the first and second guiding portions 235 and 236 is provided with at least one hook. Such a hook may be provided at one of the air-inlet side flange and the air-outlet side flange, or between them. If only the indented portions can prevent a group of wires from protruding beyond the outer peripheries of the flanges by themselves, the hook may be omitted.

In the axial fan units of the aforementioned preferred embodiment, the number contained in each group of wires is not limited to three. Four or more wires may be contained in each group of wires, or two wires may be contained.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An axial fan unit comprising first and second axial fans coaxial with and connected to each other, wherein
the fan unit has a center axis along which the first and second fans are coaxial, and four sides each parallel to the center axis such that the fan unit has the approximate form of a quadrangular prism,
the first axial fan includes:
a first impeller having first blades disposed about the center axis;
a first motor operable to rotate the first impeller about the center axis to generate an axial air flow;
a first group of electrically wires connected to the first motor; and
a first housing member including a hollow, approximately cylindrical first body surrounding the first impeller and first flanges provided at axial ends of the first body, respectively;
the second axial fan includes:
a second impeller having second blades disposed about the center axis;
a second motor operable to rotate the second impeller about the center axis to generate an axial air flow in the same direction as that generated by rotation of the first impeller;
a second group of wires electrically connected to the second motor; and
a second housing member including a hollow, approximately cylindrical second body surrounding the second impeller and second flanges provided at axial ends of the second body, respectively; and
the first flanges of the first housing member and the second flanges of the second housing member have approximately the same outer square shape as seen along the center axis such that each of the flanges has four outer peripheral side surfaces and four corners,
the first and second housing members are joined together such that the outer peripheral side surfaces of the first flanges are axially aligned with the outer peripheral side surfaces of the second flanges, respectively, and the outer peripheral side surfaces of each of the flanges are respectively substantially coextensive with sides of the quadrangular prism, respectively,
one of the first flanges of the first housing member has first and second receiving portions disposed along different sides of the fan unit, the first receiving portion receiving therein the first group of wires and the second receiving portion receiving therein the second group of wires, and
the first group of wires extending approximately axially along one of said different sides of the fan unit and the second group of wires extending approximately axially along the other of said different sides of the fan unit without the wires of either of said groups protruding beyond outer peripheries of the first flanges respectively.

2. An axial fan unit according to claim 1, wherein the different sides of the fan unit, along which the first and second receiving portions are disposed, respectively, intersect each other at a corner of said one of the flanges.

3. An axial fan unit according to claim 1, wherein the different sides of the fan unit, along which the first and second receiving portions are disposed, respectively, are parallel to each other.

4. An axial fan unit according to claim 1, wherein the first and second receiving portions of said one of the first flanges of the first housing member comprise first and second restriction portions, respectively, each of the first and second restriction portions including a portion of a respective one of the outer peripheral side surfaces of said one of the first flanges.

5. An axial fan unit according to claim 4, wherein the first and second restriction portions are hooks, respectively, each having an outer surface constituted by a said portion of a respective one of the outer peripheral surfaces of said one of the first flanges.

6. An axial fan unit according to claim 4, wherein each of the first and second restriction portions is flush with one of the axial ends of the first housing member.

7. An axial fan unit according to claim 4, wherein each of the first and second restriction portions is adjacent and axially spaced apart from one of the axial ends of the first housing member.

8. An axial fan unit according to claim 1, wherein the first housing member includes at least one rib axially extending between the first flanges on an outer surface of the first body.

9. An axial fan unit according to claim 1, wherein the first housing member defines a guiding groove, axially extending on between the first flanges and aligned with one of the first and second receiving portions, one of the first and second groups of wires extending within the guiding groove to or from said one of the first and second receiving portions.

10. An axial fan unit according to claim 1, wherein the first housing member defines first and second guiding grooves, axially extending between the first flanges and aligned with the first and second receiving portions, respectively, the first and second groups of wires extending within the guiding grooves, respectively, to or from the first and second receiving portions parallel to the center axis.

11. An axial fan unit according to claim 1, wherein the first and second housing members have approximately the same shape as each other.

12. An axial fan unit according to claim 1, wherein both the first and second groups of wires extend away from the housing members of the fan unit at an axial end of the first housing member which is opposite to the second housing member.

13. An axial fan unit according to claim 12, wherein the axial end of the first housing member from which both the first and second groups of wires extend away from the housing members of the fan unit is an air-inlet end of the first axial fan.

14. An axial fan unit according to claim 1, further comprising a binding member binding the first and second groups of wires together at a location axially spaced from the axial end of the first axial fan opposite to the second axial fan.

15. An axial fan unit according to claim 1, wherein the first and second impellers are rotated in opposite directions to each other.

16. An axial fan unit comprising first and second axial fans coaxial with and connected to each other, wherein
the fan unit has a center axis along which the first and second fans are coaxial, and four sides each parallel to the center axis such that the fan unit has the approximate form of a quadrangular prism,
the first axial fan includes:
a first impeller having first blades disposed about the center axis;
a first motor operable to rotate the first impeller about the center axis to generate an axial air flow;
a first group of electrically wires connected to the first motor; and
a first housing member including a hollow, approximately cylindrical first body surrounding the first impeller and first flanges provided at axial ends of the first body, respectively;
the second axial fan includes:
a second impeller having second blades disposed about the center axis;
a second motor operable to rotate the second impeller about the center axis to generate an axial air flow in the same direction as that generated by rotation of the first impeller;
a second group of wires electrically connected to the second motor; and
a second housing member including a hollow, approximately cylindrical second body surrounding the second impeller and second flanges provided at axial ends of the second body, respectively; and
the first flanges of the first housing member and the second flanges of the second housing member have approximately the same outer square shape as seen along the center axis such that each of the flanges has four outer peripheral side surfaces and four corners,
the first and second housing members are joined together such that the outer peripheral side surfaces of the first flanges are axially aligned with the outer peripheral side surfaces of the second flanges, respectively, and the outer peripheral side surfaces of each of the flanges are respectively substantially coextensive with sides of the quadrangular prism, respectively
each of the first flanges of the first housing member has both first and second receiving portions, at least one of the first receiving portions receiving therein the first group of wires and at least one of the second receiving portions receiving therein the second group of wires, the first group of wires extending along the exterior of the first housing of the fan unit between the first flanges without protruding beyond outer peripheries of the first flanges, and the first receiving portions being disposed along one of the sides of the fan unit and the second receiving portions being disposed along another of the sides of the fan unit such that at least a portion of the first group of wires extend along said one of the sides of the fan unit and at least a portion of the second group of wires extend along said other of the sides of the fan unit.

17. An axial fan having a center axis, and four sides each parallel to the center axis such that the fan has the approximate form of a quadrangular prism, the fan comprising:
an impeller including a plurality of blades disposed about the center axis;
a motor operable to rotate the impeller about the center axis to generate an axial air flow;
a housing member having a hollow, approximately cylindrical body surrounding the impeller and flanges at axial ends of the body, respectively; and
a plurality of ribs disposed about the center axis, the ribs supporting the motor and connecting the motor to the housing member, wherein
the flanges having approximately the same outer square shape as each other as seen along the center axis such that each of the flanges has four outer peripheral side surfaces and four corner portions which join respective pairs of the outer peripheral side surfaces to one another, and such that the outer peripheral side surfaces of the flanges are respectively substantially coextensive with sides of the quadrangular prism,
the flanges of the housing member comprise first and second receiving portions each for receiving wires connected to a motor of an axial fan,
the first receiving portion is disposed along one of the sides of the fan adjacent and the second receiving portion is disposed along another of the sides of the fan such that wires received in the receiving portions will extend at least partly along different sides of the fan,
each of the first and second receiving portions is located adjacent a corner portion of one of the flanges, and
all of the ribs which support the motor in the fan adjoin an inner surface of the body of the housing member at locations, respectively, each offset radially with respect to the center axis from the receiving portions and the adjacent corner portion.

18. An axial fan according to claim 17, wherein the first and second receiving portions of said one of the first flanges of the housing member comprise first and second restriction portions, respectively, each of the first and second restriction portions including a portion of a respective one of the outer peripheral side surfaces of the flanges.

19. An axial fan according to claim 18, wherein the first and second restriction portions are hooks, respectively, each having an outer surface constituted by a said portion of a respective one of the outer peripheral surfaces of the flanges.

20. An axial fan according to claim 19, wherein each of the first and second restriction portions are flush with one of the axial ends of the housing member.

21. An axial fan according to claim 19, wherein each of the first and second restriction portions are adjacent and axially spaced apart from one of the axial ends of the housing member.

22. An axial fan according to claim 17, wherein the housing member includes at least one rib axially extending on an outer surface of the body between the flanges.

23. An axial fan according to claim 17, wherein the housing member defines a guiding groove, axially extending between the flanges and aligned with one of the first and second receiving portions, for guiding wires to or from said one of the first and second receiving portions.

24. An axial fan according to claim 17, wherein the housing member defines first and second guiding grooves, axially extending between the flanges and aligned with the first and second receiving portions, respectively, for guiding groups of wires to or from the first and second receiving portions, respectively.

25. An axial fan unit comprising two or more axial fans each as claimed in claim 17, further comprising a first group of wires connected to the motor of one of the axial fans, a second group of wires connected to the motor of another of the axial fans, and a binding member binding the first and second groups of wires together into one group, and wherein the first group of wires is received in the first receiving portion of said one of the axial fans, the second group of wires is received in the second receiving portion of said one of the axial fans, and the binding member binds the first and second groups of wires into one group at a location outside the housing member of said one of the axial fans.

26. An axial fan unit comprising two or more axial fans each as claimed in claim 17, wherein the two or more axial fans are coaxial with and connected to each other.

27. An axial fan unit comprising first and second axial fans connected to each other, wherein
the fan unit has a center axis along which the first and second fans are coaxial, and four sides each parallel to the center axis such that the fan unit has the approximate form of a quadrangular prism,
the first axial fan includes:
a first impeller having first blades disposed about a center axis of the first and second axial fans;
a first motor operable to rotate the first impeller about the center axis to generate an axial air flow;
a first group of electrically wires connected to the first motor; and
a first housing member including a hollow body surrounding the first impeller, and approximately square first flanges provided at axial ends of the hollow body, respectively, and
the second axial fan includes:
a second impeller having first blades disposed about a center axis of the first and second axial fans;
a second motor operable to rotate the second impeller about the center axis to generate an axial air flow in the same direction as that generated by rotation of the first impeller;
a second group of electrically wires connected to the second motor; and
a second housing member including a hollow body surrounding the second impeller, and second flanges provided at axial ends of the hollow body, respectively,
the first and second flanges have approximately the same outer square shape as each other as seen along the center axis such that each of the flanges has four outer peripheral side surfaces and four corner portions which join respective pairs of the outer peripheral side surfaces to one another, and such that the outer peripheral side surfaces of the flanges are respectively substantially coextensive with sides of the quadrangular prism, and
one of the first flanges of the first housing member comprises first and second receiving portions receiving therein the first group of wires and the second groups of wires, respectively, the first receiving portions being located adjacent one of the corner portions of said one of the first flanges and the second receiving portion being located adjacent another of the corner portions of said one of the first flanges such that the first and second groups of wires received in the first and second receiving portions extend adjacent two different corner portions, respectively, of said one of the first flanges.

28. An axial fan unit comprising first and second axial fans,
the fan unit having a center axis along which the first and second fans are coaxial, and four sides each parallel to the center axis such that the fan unit has the approximate form of a quadrangular prism,
each of the first and second axial fans including:
an impeller operable to rotate about the center axis;
an electric motor operable to rotate the impeller about the center axis;
a housing member surrounding the impeller and having a hollow body and flanges at axial ends of the body, respectively, the flanges being of approximately the same square outer shape as each other as seen along the center axis such that each of the flanges has four outer peripheral side surfaces and four corner portions which join respective pairs of the outer peripheral side surfaces to one another; and
a group of wires electrically connected to the electric motor, and
wherein the first and second axial fans are joined together with the outer peripheral side surfaces of the flanges thereof coextensive with sides of the quadrangular prism, respectively,
the flanges of the housing member of each of the fans comprise first and second receiving portions, the first receiving portions of the first and second fans being disposed along one of the sides of the fan unit and the second receiving portions of the first and second fans being disposed along another of the sides of the fan unit,
the group of wires of the first axial fan and the group of wires of the second axial fan extending through the first and second receiving portions of the first axial fan, respectively, such that the group of wires of the first axial fan extend at least partly on said one of the sides of the fan unit and the group of wires of the second axial fan extend at least partly on said other of the sides of the fan unit, and
the groups of wires of the first and the second axial fans extend through said at least one each of the first and second receiving portions, respectively, toward an axial end of the first axial fan opposite to the second axial fan.

29. An axial fan unit according to claim 28, wherein each of the flanges of the housing member of the first axial fan comprises respective ones of the first and second receiving portions, the first receiving portions of the flanges of the housing member of the first axial fan being aligned with each other in the direction of the center axis, and the second receiving portions of the flanges of the housing member of the first axial fan being aligned with each other in the direction of the center axis.

30. An axial fan unit according to claim 29, wherein the group of wires of the first axial fan passes through both of the first receiving portions of the flanges of the housing member of the first axial fan, and the group of wires of the second axial fan passes through both of the second receiving portions of the flanges of the housing member of the first axial fan.

31. An axial fan unit according to claim 29, wherein both the group of wires of the first axial fan and the group of wires of the second axial fan pass through the first receiving portion of the flange of the first axial fan which is opposite to the second axial fan and extend to outside of the first axial fan from said flange.

32. An axial fan unit according to claim 31, wherein the group of wires of the first axial fan passes through the first receiving portion of the other of the flanges of the first axial fan, and the group of wires of the second axial fan passes through the second receiving portion of said other of the flanges of the first axial fan.

33. An axial fan unit according to claim 31, wherein the flange of the first axial fan which is opposite to the second axial fan is located on a side of the first axial fan at which the first axial fan draws in air.

34. An axial fan unit according to claim 28, further comprising a binding member that binds both the group of wires of the first axial fan and the group of wires of the second axial fan into one group at the outside of the housing members of the axial fans.

35. An axial fan unit according to claim 28, wherein the first and second receiving portions comprise first and second restriction portions, respectively, capable of preventing the group of wires received in the first and second receiving portions from protruding beyond the outer periphery of the flanges.

36. An axial fan unit according to claim 35, wherein each of the first and second restriction portions is a hook having an outer surface constituted by a portion of an outer peripheral side surface of one of the flanges.

37. An axial fan unit according to claim 28, wherein the housing member of each of the fans defines at least one guiding groove extending between the flanges of the housing member and axially aligned with at least one of the receiving portions.

38. An axial fan unit according to claim 28, wherein the first and second receiving portions of each of the axial fans are located adjacent a corner portion of one of the flanges of the fan, and the housing member of each of the fans has at least one rib axially extending on the body between said corner portion of the one flanges of the fan and a corresponding corner portion of the other of the flanges of the fan.

39. An axial fan unit according to claim 28, wherein the groups of wires of the first and second axial fans extend out from the housing members of the first and second axial fans at respective locations each adjacent a joint between the first and second axial fans.

* * * * *